United States Patent
Zeng et al.

(10) Patent No.: US 10,348,331 B2
(45) Date of Patent: Jul. 9, 2019

(54) DECODING METHOD AND APPARATUS OF POLAR CODE

(71) Applicant: Huawei Technologies Co., Ltd., Shenzhen (CN)

(72) Inventors: Yanxing Zeng, Shenzhen (CN); Jianqiang Shen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 162 days.

(21) Appl. No.: 15/137,962

(22) Filed: Apr. 25, 2016

(65) Prior Publication Data

US 2016/0241258 A1 Aug. 18, 2016

Related U.S. Application Data

(63) Continuation of application No. PCT/CN2013/086019, filed on Oct. 26, 2013.

(51) Int. Cl.
*H03M 13/15* (2006.01)
*H03M 13/29* (2006.01)
(Continued)

(52) U.S. Cl.
CPC ..... *H03M 13/1575* (2013.01); *G06F 11/1072* (2013.01); *H03M 13/13* (2013.01);
(Continued)

(58) Field of Classification Search
CPC ............ H03M 13/1575; H03M 13/13; H03M 13/134; H03M 13/256; H03M 13/616; H03M 13/2933; G06F 11/1072
(Continued)

(56) References Cited

U.S. PATENT DOCUMENTS 6,215,827 B1 * 4/2001 Balachandran ....... H04L 1/0003
375/262
8,245,116 B2 * 8/2012 Orlik .................. H03M 13/136
714/780
(Continued)

FOREIGN PATENT DOCUMENTS

CN 101771644 A 7/2010
CN 103220001 A 7/2013
(Continued)

OTHER PUBLICATIONS

Li et al., "An Adaptive Successive Cancellation List Decoder for Polar Codes with Cyclic Redundancy Check," IEEE Communications Letters, vol. 16, Issue 12, pp. 2044-2047, Institute of Electrical and Electronics Engineers, New York, New York (Dec. 2012).
(Continued)

*Primary Examiner* — John J Tabone, Jr.
(74) *Attorney, Agent, or Firm* — Leydig, Voit & Mayer, Ltd.

(57) ABSTRACT

Embodiments of the present disclosure provide a decoding method of a polar code, including: acquiring a receiving sequence and a check matrix, wherein the receiving sequence is output on a channel after an input mapping sequence is encoded; carrying out Trellis path search according to the receiving sequence and the check matrix, and calculating Trellis path likelihood information corresponding to the input mapping sequence; calculating a decision value corresponding to the input mapping sequence according to the Trellis path likelihood information; and de-mapping the calculated decision value corresponding to the input mapping sequence according to a preset mapping relation to obtain a decoding sequence. The input mapping sequence belongs to a finite field GF(q), when decoding the polar code, the Trellis path search is carried out, and the
(Continued)

decision value is calculated and de-mapped to simultaneously reduce a maximum list value and greatly reduce an average list value.

20 Claims, 5 Drawing Sheets

(51) Int. Cl.
*G06F 11/10* (2006.01)
*H03M 13/13* (2006.01)
*H03M 13/25* (2006.01)
*H03M 13/00* (2006.01)

(52) U.S. Cl.
CPC ....... *H03M 13/134* (2013.01); *H03M 13/256* (2013.01); *H03M 13/2933* (2013.01); *H03M 13/616* (2013.01)

(58) Field of Classification Search
USPC .................. 714/776, 792, 758, 781, 799
See application file for complete search history.

(56) References Cited

U.S. PATENT DOCUMENTS

| | | | | |
|---|---|---|---|---|
| 8,656,263 | B2* | 2/2014 | Hu | H03M 13/253 714/758 |
| 9,454,552 | B2* | 9/2016 | Ma | G06F 17/30312 |
| 9,503,126 | B2* | 11/2016 | Vardy | H03M 13/13 |
| 2012/0185755 | A1* | 7/2012 | Orlik | H03M 13/136 714/781 |
| 2012/0240006 | A1* | 9/2012 | Hu | H03M 13/253 714/756 |
| 2013/0117344 | A1 | 5/2013 | Gross et al. | |
| 2014/0019820 | A1* | 1/2014 | Vardy | H03M 13/13 714/752 |
| 2014/0040214 | A1* | 2/2014 | Ma | G06F 17/30312 707/693 |
| 2014/0365842 | A1 | 12/2014 | Li et al. | |
| 2015/0026543 | A1 | 1/2015 | Li et al. | |

FOREIGN PATENT DOCUMENTS

| | | |
|---|---|---|
| CN | 103368583 A | 10/2013 |
| WO | WO 2013152605 A1 | 10/2013 |

OTHER PUBLICATIONS

Arikan, "Channel Polarization: A Method for Constructing Capacity-Achieving Codes for Symmetric Binary-Input Memoryless Channels," IEEE Transaction on Information Theory, vol. 44, Issue 7, pp. 3051-3073, Institute of Electrical and Electronics Engineers, New York, New York (Jul. 2009).

Wolf, "Efficient Maximum Likelihood Decoding of Linear Block Codes Using a Trellis," IEEE Transactions on Information Theory, vol. IT-24, Issue 1, pp. 76-80, Institute of Electrical and Electronics Engineers, New York, New York (Jan. 1978).

Chen et al., "Improved Successive Cancellation Decoding of Polar Codes," IEEE Transactions on Communications, vol. 61, Issue 8, pp. 3100-3107, Institute of Electrical and Electronics Engineers, New York, New York (Aug. 2013).

Tal et al., "List Decoding of Polar Codes," 2011 IEEE International Symposium on Information Theory Proceedings, pp. 1-5, Institute of Electrical and Electronics Engineers, New York, New York (2011).

* cited by examiner

DECODING METHOD AND APPARATUS OF POLAR CODE

CROSS-REFERENCE TO RELATED APPLICATIONS

This application is a continuation of International Patent Application No. PCT/CN2013/086019, filed on Oct. 26, 2013, which is hereby incorporated by reference in its entirety.

TECHNICAL FIELD

The present disclosure relates to the field of communication, in particular to a decoding method and apparatus of a polar code.

BACKGROUND

With the increase of artificial channel extended dimensions, the symmetric capacity of a channel respectively approaches to 0 or 1, a polar code is constructed in the channel, when the symmetric capacity of the channel is better, information may be transmitted, and when the symmetric capacity of the channel is close to 0, no information is transmitted on the channel.

In the conventional art, encoding and decoding are carried out in a GF(2) field. Encoding is carried out via polar (Polar) code cascading CRC, the original k bits used for transmitting information bits are divided into two parts, k-r bits are used for transmitting information, and the rest r bits are used for carrying out r-bit CRC check on the previous k-r bits. When performing SCL (successive cancellation list) decoding, the CRC check is carried out on each survival path, and if at least one survival path in all list survival paths may pass the CRC check, a path having the maximum likelihood function is selected from the survival paths passing the CRC check; and otherwise, the path having the maximum likelihood function is selected from all list survival paths to serve as a decision path. After decoding, list layers of different encoding code words are not constant, all encoding code words share list resources, the CRC check is carried out on each branch to decide whether stopping searching the survival path or not, if the CRC check is passed, the search on the survival path is stopped, and otherwise, the list value is increased to continue the search. The times of making CRC decision for the decoding survival paths of most encoding code words is small, and the CRC check may be passed after several times of research, therefore the saved list resources may be allocated to unreliable encoding code words, finally, an average list value is much smaller than a constant list value, and the small average list value corresponds to the reduction of a counted average decoding time delay. However, a quite large list value (nearly one million) is necessary for approaching ML decoding performance, and simulation finds that, for most polar codes, only a very small list value (several times of List) is needed for SCL decoding success, but for a few polar codes, a quite large list value is needed for SCL decoding success.

In an existing technical solution, although the average list value may be reduced, a maximum list value is quite large, while in a specific logic implementation process, at a development level of the current FPGA (Field-Programmable Gate Array), fixed logic resources still need to be configured according to the maximum list value to improve the degree of parallelism, so as to increase the occupancy volume of total logic resources, additionally, the user experience depends on FER (Frame Error Ratio), and the FER performance depends on the maximum list value. In the conventional art, the maximum list value cannot be reduced while reducing the average list value greatly.

SUMMARY

Embodiments of the present disclosure provide a decoding method and apparatus of a polar code, for solving the technical problem in the conventional art that the decoding of the polar code cannot simultaneously reduce a maximum list value and greatly reduce an average list value.

In a first aspect of an embodiment of the current application, a decoding method of a polar code is provided, including:

acquiring a receiving sequence and a check matrix, wherein the receiving sequence is output on a channel after an input mapping sequence is encoded;

carrying out Trellis path search according to the acquired receiving sequence and the check matrix, and calculating Trellis path likelihood information corresponding to the input mapping sequence;

calculating a decision value corresponding to the input mapping sequence according to the calculated Trellis path likelihood information corresponding to the input mapping sequence; and de-mapping the calculated decision value corresponding to the input mapping sequence according to a preset mapping relation to obtain a decoding sequence.

In a first possible implementation manner of the first aspect, the input mapping sequence is a sequence obtained by mapping an input sequence according to the preset mapping relation; and the calculating Trellis path likelihood information corresponding to the input mapping sequence includes:

calculating the Trellis path likelihood information corresponding to the input mapping sequence according to an encoding sequence, wherein the encoding sequence is a sequence obtained by encoding the input mapping sequence.

In combination with the first aspect and the first possible implementation manner of the first aspect, in a second possible implementation manner of the first aspect, the input mapping sequence is a symbol set which belongs to a finite field GF(q) and includes a plurality of input mapping values, wherein $q=2^m$, and m is a positive integer greater than 1; and the preset mapping relation includes: correspondingly mapping every m bits in the input sequence to each input mapping value.

In combination with the second possible implementation manner of the first aspect, in a third possible implementation manner of the first aspect, the encoding sequence is a sequence obtained by encoding the input mapping sequence through an encoding formula, the encoding formula is: $x_1^N = u_1^N G_N$, the encoding sequence is obtained by $x_1^N$ through an encoding channel, wherein $u_1^N$ refers to the input mapping sequence, $G_N$ refers to a preset N-order generator matrix, $G_N = B_N F^{\otimes n}$, $B_N$ refers to a permutation matrix, $F^{\otimes n}$ refers to a Kronecker power, $F^{\otimes n} = F \otimes F^{\otimes (n-1)}$, N refers to a code length, $N = m2^{mn}$, $n \geq 0$.

In combination with the third possible implementation manner of the first aspect, in a fourth possible implementation manner of the first aspect, the calculating Trellis path likelihood information corresponding to the input mapping sequence includes:

calculating the Trellis path likelihood information corresponding to the input mapping sequence according to a condition likelihood function formula, and the condition likelihood function formula is:

$$L^{(i)}(y_1^N, \hat{u}_1^{i-1}) = \binom{i \in GF(q)}{(u_i/\hat{u}_1^{i-1}, y_1^N)}^{argmax} P_{u_i/U_1^{i-1}, Y_1^N},$$

wherein, $y_1^N$ refers to the receiving sequence, $u_1^N$ and $y_1^N$ satisfy probability distribution:

$$P_{U_1^N, Y_1^N}(u_1^N, y_1^N) = \frac{1}{q^N} W^N(y_1^N / u_1^N G_N).$$

In combination with the fourth possible implementation manner of the first aspect, in a fifth possible implementation manner of the first aspect, the parameter of the polar code is (N, K, A, $u_{A^C}$), A refers to a set of information bit indexes, $A^C$ refers to a complementary set of A, K refers to the number of elements in A, and $u_{A^C}$ refers to frozen bits with the number of (N−K);

the calculating a decision value corresponding to the input mapping sequence according to the calculated Trellis path likelihood information corresponding to the input mapping sequence includes:

if $i \subset A$, making $\hat{u}_i = L^{(i)}(y_1^N, \hat{u}_1^{i-1})$; and
if $i \subset A^C$, making $\hat{u}_i = u_i$.

In combination with any one of the first aspect, the first possible implementation manner of the first aspect, the second possible implementation manner of the first aspect, the third possible implementation manner of the first aspect, the fourth possible implementation manner of the first aspect and the fifth possible implementation manner of the first aspect, in a sixth possible implementation manner of the first aspect, when m=2, the input mapping sequence is a sequence composed of elements in (0, 1, $\alpha$, $\alpha^2$); and the preset N-order generator matrix is: $G_4 = B_4 F_{RS4}^{\otimes n}$, wherein, $$F_{RS4} = \begin{pmatrix} 1 & 1 & 1 & 0 \\ \alpha & \alpha^2 & 1 & 0 \\ \alpha^2 & \alpha & 1 & 0 \\ 1 & 1 & 1 & \alpha \end{pmatrix}.$$

In combination with any one of the first aspect, the first possible implementation manner of the first aspect, the second possible implementation manner of the first aspect, the third possible implementation manner of the first aspect, the fourth possible implementation manner of the first aspect and the fifth possible implementation manner of the first aspect, in a seventh possible implementation manner of the first aspect, when m=3, the input mapping sequence is a sequence composed of elements in (0, 1, $\alpha$, $\alpha^2$, $\alpha^3$, $\alpha^4$, $\alpha^5$, $\alpha^6$); and the preset N-order generator matrix is: $G_8 = B_8 F_{RS8}^{\otimes n}$, wherein, $$F_{RS8} = \begin{pmatrix} 1 & 1 & 1 & 1 & 1 & 1 & 1 & 0 \\ \alpha & \alpha^2 & \alpha^3 & \alpha^4 & \alpha^5 & \alpha^6 & 1 & 0 \\ \alpha^2 & \alpha^4 & \alpha^6 & \alpha^1 & \alpha^3 & \alpha^5 & 1 & 0 \\ \alpha^3 & \alpha^6 & \alpha^2 & \alpha^5 & \alpha^1 & \alpha^4 & 1 & 0 \\ \alpha^4 & \alpha^1 & \alpha^5 & \alpha^2 & \alpha^6 & \alpha^3 & 1 & 0 \\ \alpha^5 & \alpha^3 & \alpha^1 & \alpha^6 & \alpha^4 & \alpha^2 & 1 & 0 \\ \alpha^6 & \alpha^5 & \alpha^4 & \alpha^3 & \alpha^2 & \alpha^1 & 1 & 0 \\ 1 & 1 & 1 & 1 & 1 & 1 & 1 & \alpha \end{pmatrix}.$$

In combination with the sixth possible implementation manner of the first aspect, in an eighth possible implementation manner of the first aspect, when m=2, the check matrix includes a first check matrix and a second check matrix, and the first check matrix is: $H_{01} = (1\ 1\ 1\ \alpha^2)$; and the second check matrix is:

$$H_{02} = \begin{pmatrix} 1 & 1 & 1 & \alpha^2 \\ \alpha & \alpha^2 & 0 & \alpha^2 \end{pmatrix}.$$

In combination with the eighth possible implementation manner of the first aspect, in a ninth possible implementation manner of the first aspect, when m=3, the check matrix includes a third check matrix, a fourth check matrix, a fifth check matrix and a sixth check matrix, wherein the third check matrix is: $H_{001} = (1\ 1\ 1\ 1\ 1\ 1\ 1\ \alpha^6)$;

the fourth check matrix is:

$$H_{002} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \end{pmatrix};$$

the fifth check matrix is:

$$H_{003} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \end{pmatrix};$$

and
the sixth check matrix is:

$$H_{004} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \\ \alpha^4 & \alpha^1 & \alpha^5 & \alpha^2 & \alpha^6 & \alpha^3 & 1 & 0 \end{pmatrix}.$$

In a second aspect, a decoding apparatus of a polar code provided by the embodiments of the present disclosure includes:

an acquisition module, configured to acquire a receiving sequence and a check matrix, wherein the receiving sequence is output on a channel after an input mapping sequence is encoded;

a path processing module, configured to carry out Trellis path search according to the acquired receiving sequence and the check matrix, and calculate Trellis path likelihood information corresponding to the input mapping sequence;

a making decision module, configured to calculate a decision value corresponding to the input mapping sequence according to the calculated Trellis path likelihood information corresponding to the input mapping sequence; and a de-mapping module, configured to de-map the calculated decision value corresponding to the input mapping sequence according to a preset mapping relation to obtain a decoding sequence.

In a first possible implementation manner of the second aspect, the input mapping sequence is a sequence obtained by mapping an input sequence according to the preset mapping relation; and the path processing module is configured to:

calculate the Trellis path likelihood information corresponding to the input mapping sequence according to an encoding sequence, wherein the encoding sequence is a sequence obtained by encoding the input mapping sequence.

In combination with the second aspect and the first possible implementation manner of the second aspect, in a second possible implementation manner of the second aspect, the input mapping sequence is a symbol set which belongs to a finite field GF(q) and includes a plurality of input mapping values, wherein $q=2^m$, and m is a positive integer greater than 1; and the preset mapping relation includes: correspondingly mapping every m bits in the input sequence to each input mapping value.

In combination with the first possible implementation manner of the second aspect, in a third possible implementation manner of the second aspect, the encoding sequence is a sequence obtained by encoding the input mapping sequence through an encoding formula, the encoding formula is: $x_1^N = u_1^N G_N$, the encoding sequence is obtained by $x_1^N$ through an encoding channel, wherein $u_1^N$ refers to the input mapping sequence, $G_N$ refers to a preset N-order generator matrix, $G_N = B_N F^{\otimes n}$, $B_N$ refers to a permutation matrix, $F^{\otimes n}$ refers to a Kronecker power, $F^{\otimes n} = F \otimes F^{\otimes(n-1)}$, N refers to a code length, $N = m2^{mn}$, $n \geq 0$.

In combination with the third possible implementation manner of the second aspect, in a fourth possible implementation manner of the second aspect, the path processing module includes:

a calculating unit, configured to calculate the Trellis path likelihood information corresponding to the input mapping sequence according to a condition likelihood function formula, and the condition likelihood function formula is:

$$L^{(i)}(y_1^N, \hat{u}_1^{i-1}) = (u_u^i \in GF(q)^{argmax} P_{u_i/U_1^{i-1}, Y_1^N}(u_i/\hat{u}_1^{i-1}, y_1^N)),$$

wherein, $y_1^N$ refers to the receiving sequence, $u_1^N$ and $y_1^N$ satisfy probability distribution:

$$P_{U_1^N, Y_1^N}(u_1^N, y_1^N) = \frac{1}{q^N} W^N(y_1^N / u_1^N G_N).$$

In combination with the fourth possible implementation manner of the second aspect, in a fifth possible implementation manner of the second aspect, the parameter of the polar code is (N, K, A, $u_{A^C}$), A refers to a set of information bit indexes, $A^C$ refers to a complementary set of A, K refers to the number of elements in A, and $u_{A^C}$ refers to frozen bits with the number of (N−K);

the calculating a decision value corresponding to the input mapping sequence according to the calculated Trellis path likelihood information corresponding to the input mapping sequence through the making decision module includes:

if $i \subset A$, making $\hat{u}_i = L^{(i)}(y_1^N, \hat{u}_1^{i-1})$; and if $i \subset A^C$, making $\hat{u}_i = u_i$.

In combination with any one of the second aspect, the first possible implementation manner of the second aspect, the second possible implementation manner of the second aspect, the third possible implementation manner of the second aspect, the fourth possible implementation manner of the second aspect and the fifth possible implementation manner of the second aspect, in a sixth possible implementation manner of the second aspect, when m=2, the input mapping sequence is a sequence composed of elements in (0, 1, α, α²); and the preset N-order generator matrix is: $G_4 = B_4 F_{RS4}^{\otimes n}$, wherein, $$F_{RS4} = \begin{pmatrix} 1 & 1 & 1 & 0 \\ \alpha & \alpha^2 & 1 & 0 \\ \alpha^2 & \alpha & 1 & 0 \\ 1 & 1 & 1 & \alpha \end{pmatrix}.$$

In combination with any one of the second aspect, the first possible implementation manner of the second aspect, the second possible implementation manner of the second aspect, the third possible implementation manner of the second aspect, the fourth possible implementation manner of the second aspect and the fifth possible implementation manner of the second aspect, in a seventh possible implementation manner of the second aspect, when m=3, the input mapping sequence is a sequence composed of elements in (0, 1, α, α², α³, α⁴, α⁵, α⁶); and the preset N-order generator matrix is: $G_8 = B_8 F_{RS8}^{\otimes n}$, wherein, $$F_{RS8} = \begin{pmatrix} 1 & 1 & 1 & 1 & 1 & 1 & 1 & 0 \\ \alpha & \alpha^2 & \alpha^3 & \alpha^4 & \alpha^5 & \alpha^6 & 1 & 0 \\ \alpha^2 & \alpha^4 & \alpha^6 & \alpha^1 & \alpha^3 & \alpha^5 & 1 & 0 \\ \alpha^3 & \alpha^6 & \alpha^2 & \alpha^5 & \alpha^1 & \alpha^4 & 1 & 0 \\ \alpha^4 & \alpha^1 & \alpha^5 & \alpha^2 & \alpha^6 & \alpha^3 & 1 & 0 \\ \alpha^5 & \alpha^3 & \alpha^1 & \alpha^6 & \alpha^4 & \alpha^2 & 1 & 0 \\ \alpha^6 & \alpha^5 & \alpha^4 & \alpha^3 & \alpha^2 & \alpha^1 & 1 & 0 \\ 1 & 1 & 1 & 1 & 1 & 1 & 1 & \alpha \end{pmatrix}.$$

In combination with the sixth possible implementation manner of the second aspect, in an eighth possible implementation manner of the second aspect, when m=2, the check matrix includes a first check matrix and a second check matrix, wherein the first check matrix is: $H_{01} = (1\ 1\ 1\ \alpha^2)$; and the second check matrix is:

$$H_{02} = \begin{pmatrix} 1 & 1 & 1 & \alpha^2 \\ \alpha & \alpha^2 & 0 & \alpha^2 \end{pmatrix}.$$

In combination with the eighth possible implementation manner of the second aspect, in a ninth possible implementation manner of the second aspect, when m=3, the check matrix includes a third check matrix, a fourth check matrix, a fifth check matrix and a sixth check matrix, wherein the third check matrix is: $H_{001} = (1\ 1\ 1\ 1\ 1\ 1\ 1\ \alpha^6)$;

the fourth check matrix is:

$$H_{002} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \end{pmatrix};$$

the fifth check matrix is:

$$H_{003} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \end{pmatrix};$$

and
the sixth check matrix is $$H_{004} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \\ \alpha^4 & \alpha^1 & \alpha^5 & \alpha^2 & \alpha^6 & \alpha^3 & 1 & 0 \end{pmatrix}.$$

By implementing the embodiments of the present disclosure, Trellis path search may be carried out according to a receiving sequence and a check matrix, wherein the receiving sequence is output on a channel after an input mapping sequence is encoded, a decision value corresponding to the input mapping sequence is calculated, and the decision value corresponding to the input mapping sequence is de-mapped according to a preset mapping relation to obtain a decoding sequence. The input mapping sequence is a sequence obtained by mapping an input sequence according to the preset mapping relation, the input mapping sequence belongs to a finite field GF(q), $q=2^m$, m is a positive integer greater than 1, the receiving sequence is a sequence received from the channel after the input mapping sequence is encoded, when decoding the polar code, carrying out the Trellis path search, calculating the decision value and de-mapping, so as to simultaneously reduce a maximum list value and greatly reduce an average list value.

BRIEF DESCRIPTION OF DRAWINGS

To illustrate technical solutions in the embodiments of the present disclosure or in the conventional art more clearly, a brief introduction on the accompanying drawings which are needed in the description of the embodiments or the conventional art is given below. Apparently, the accompanying drawings in the description below are merely some of the embodiments of the present disclosure, based on which other drawings may also be obtained by those of ordinary skill in the art without any creative effort.

DESCRIPTION OF EMBODIMENTS

Figure 1:
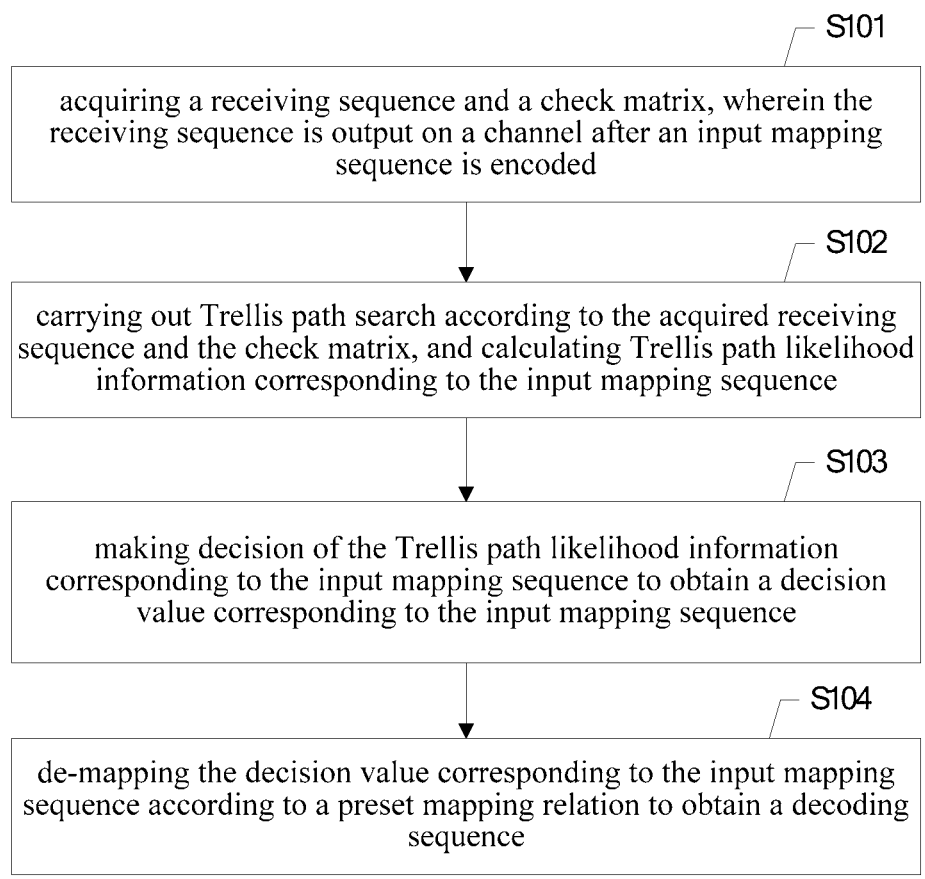
FIG. 1 is a flowchart of a decoding method of a polar code provided by an embodiment of the present disclosure.

In order to make technical problems to be solved, technical solutions and beneficial effects of the present disclosure clearer, a further detailed description of the present disclosure will be given below in combination with accompanying drawings and embodiments.

A clear description of the technical solutions in the embodiments of the present disclosure will be given below, in combination with the accompanying drawings in the embodiments of the present disclosure. Apparently, the embodiments described below are merely a part, but not all, of the embodiments of the present disclosure. All of other embodiments, obtained by those of ordinary skill in the art based on the embodiments of the present disclosure without any creative effort, fall into the protection scope of the present disclosure.

An embodiment of the present disclosure provides a decoding method and apparatus of a polar code, including: acquiring a receiving sequence and a check matrix, wherein the receiving sequence is output on a channel after an input mapping sequence is encoded; carrying out Trellis path search according to the acquired receiving sequence and the check matrix, and calculating Trellis path likelihood information corresponding to the input mapping sequence; making decision of the calculated Trellis path likelihood information corresponding to the input mapping sequence to obtain a decision value corresponding to the input mapping sequence; and de-mapping the calculated decision value corresponding to the input mapping sequence according to a preset mapping relation to obtain a decoding sequence.

As an optional implementation manner, the decoding apparatus of the polar code provided by the embodiment of the present disclosure may be a decoding terminal, wherein the decoding terminal may be a mobile user equipment, a PC user equipment, a device serving global communication or other types of user equipment, and the specific implementation manner of the user equipment is not limited.

In the conventional art, encoding and decoding are carried out in a GF(2) field. Each information bit in an input sequence is 0 or 1, during decoding, each information bit must be decoded, CRC check is carried out on each survival path, and a maximum list value is larger. In an embodiment of the present disclosure, the input sequence is mapped according to the preset mapping relation to obtain the input mapping sequence, the input mapping sequence belongs to a finite field GF(q), wherein $q=2^m$, and m is a positive integer greater than 1, namely, every m bits in the input sequence are mapped to each input mapping value, for example, when m=2, the input mapping sequence may be composed of elements in (0, 1, $\alpha$, $\alpha^2$), and the preset mapping relation may be: 00~0, 01~1, 10~$\alpha$, 11~$\alpha^2$.

During decoding, the Trellis path search is carried out according to the receiving sequence and the check matrix, wherein the receiving sequence is output on a channel after an input mapping sequence is encoded the decision value corresponding to the input mapping sequence is calculated, the decision value corresponding to the input mapping sequence is de-mapped according to the preset mapping relation, and the decoding sequence is obtained. The conventional art only involves decoding in the GF(2) field and involves no mapping relation, and Trellis path search in the conventional art does not need to be carried out, in the embodiment of the present disclosure, the decoding ($q=2^m$, and m is a positive integer greater than 1) in expanded to the GF(q) field, the input sequence is transmitted on the channel after being mapped, during the decoding, the Trellis path search is carried out, the decision value is calculated and de-mapped to obtain the decoding sequence, by simulating a polar decoding result of the embodiment of the present disclosure, and comparing with an simulating result of the polar decoding in the conventional art, it can be seen that, the embodiment of the present disclosure may be used for simultaneously reducing the maximum list value and greatly reducing the average list value. An illustration will be given below through specific embodiments.

Please refer to FIG. 1, FIG. 1 is a flowchart of a decoding method of a polar code provided by an embodiment of the present disclosure, wherein, the decoding method of the polar code as shown in FIG. 1 is described from the angle of a decoding terminal, wherein the decoding terminal may be a mobile user equipment, a PC user equipment, a device serving global communication or other types of user equipment, and the specific implementation manner of the user equipment is not limited. As shown in FIG. 1, the decoding method of the polar code provided by the embodiment includes steps S101 to S104.

S101, acquiring a receiving sequence and a check matrix, wherein the receiving sequence is output on a channel after an input mapping sequence is encoded.

S102, carrying out Trellis path search according to the acquired receiving sequence and the check matrix, and calculating Trellis path likelihood information corresponding to the input mapping sequence.

S103, making decision of the Trellis path likelihood information corresponding to the input mapping sequence to obtain a decision value corresponding to the input mapping sequence.

S104, de-mapping the decision value corresponding to the input mapping sequence according to a preset mapping relation to obtain a decoding sequence.

As an optional implementation manner, in step S101, the input mapping sequence is a sequence obtained by mapping an input sequence according to the preset mapping relation, an encoding sequence is obtained by encoding the input mapping sequence, the encoding sequence is y', and y' is transmitted in a physical medium channel, wherein the physical medium channel may be a wireless channel and may also be a wired channel, for simple expression, it is assumed in the embodiment of the present disclosure that the channel is an additive white Gaussian noise channel, y' and white Gaussian noise are transmitted to the decoding terminal, and the decoding terminal receives the sequence, namely receives the receiving sequence, which is marked as y. In the embodiment of the present disclosure, the receiving sequence y is decoded. The check matrix is a matrix set by the decoding terminal for check according to the input mapping sequence when decoding.

As an optional implementation manner, the input mapping sequence is a symbol set which belongs to a finite field GF(q) and includes a plurality of input mapping values, wherein $q=2^m$, m is a positive integer greater than 1, and optionally, the preset mapping relation includes: correspondingly mapping every m bits in the input sequence to each input mapping value.

If m=2, every 2 bits in the input sequence are correspondingly mapped to each input mapping value, the preset mapping relation must satisfy: every m bits in the input sequence are correspondingly mapped to each input mapping value, a specific corresponding mapping value may be set in a self-defining manner, for example, each information bit in the input sequence may be 0 or 1, the input mapping sequence may be set as a sequence composed of elements in $(0, 1, \alpha, \alpha^2)$, the preset mapping relation may be: 00~0, 01~1, 10~$\alpha$ and 11~$\alpha^2$, further optionally, the preset mapping relation may be: 00~0, 11~1, 01~$\alpha$ and 10~$\alpha^2$, the preset mapping relation may be set in the self-defining manner, and the specific preset mapping relation is not limited to the embodiment of the present disclosure.

Further optionally, the input mapping sequence may be set as a sequence composed of elements in $(0, 1, \alpha, \alpha^2)$ and may also be set as a sequence composed of elements in $(0, 1, \beta, \beta^2)$, or a sequence composed of elements in $(\eta, \eta^2, \eta^3, \eta^4)$, or the like, the specific input mapping value contained in the input mapping sequence may be set in the self-defining manner, in the embodiment of the present disclosure, it is taken as an example for description that the input mapping sequence is a sequence composed of elements in $(0, 1, \alpha, \alpha^2)$, and the expression of the specific input mapping value is not limited to the embodiment of the present disclosure.

If m=3, every 3 bits in the input sequence are correspondingly mapped to each input mapping value, for example, each information bit in the input sequence may be 0 or 1, the input mapping sequence may be set as a sequence composed of elements in $(0, 1, \alpha, \alpha^2, \alpha^3, \alpha^4, \alpha^5, \alpha^6)$, and the preset mapping relation may be: 000~0, 001~1, 010~$\alpha$, 011~$\alpha^2$, 100~$\alpha^3$, 101~$\alpha^4$, 110~$\alpha^5$, 111~$\alpha^6$.

As an optional implementation manner, in step S102, the Trellis path search is carried out according to the acquired receiving sequence and the check matrix, and the Trellis path likelihood information corresponding to the input mapping sequence is calculated. In the embodiment, parameter of a polar code may be set as (N, K, A, $u_A{}^c$), wherein A refers to a set of information bit indexes, $A^C$ refers to a complementary set of A, K refers to the number of elements in A, $u_A{}^c$ refers to frozen bits with the number of (N−K), and the frozen bits are generally set as 0. The input mapping sequence may be expressed as $u_1^N$, N refers to a code length, $N=m2^{mn}$, $n \geq 0$.

In the embodiment of the present disclosure, an SC (Successive Cancellation) decoding algorithm may be adopted, to mainly estimate the input mapping sequence $u_1^N$, namely obtain the decision value corresponding to the input mapping sequence. Prior to estimation, the Trellis path likelihood information corresponding to the input mapping sequence needs to be calculated, in the embodiment of the present disclosure, the Trellis path likelihood information corresponding to the input mapping sequence may be calculated according to a condition likelihood function formula, and for example, the condition likelihood function formula is:

$$L^{(i)}(y_1^N, \hat{u}_1^{i-1}) = (u^i \in GF(q))^{argmax} P_{u_i/U_1^{i-1},Y_1^N}(u_i/\hat{u}_1^{i-1}, y_1^N),$$

wherein, $y_1^N$ refers to the receiving sequence, $u_1^N$ and $y_1^N$ satisfy probability distribution:

$$P_{U_1^N, Y_1^N}(u_1^N, y_1^N) = \frac{1}{q^N} W^N(y_1^N / u_1^N G_N).$$

It should be noted that, the implementation manners of the condition likelihood function formula are multiple, for example, may be the above formula, may also be another implementation manner and are not limited to the embodiment specifically.

As an optional implementation manner, a Trellis graph refers to a directed graph having a side marker and expresses a triad (V, E, A), wherein V refers to a node set, A refers to an alphabet set, E refers to a side set, each side may be expressed as a set composed of a sequential triad (v, a, v'), v, v'∈V, a∈A. V may be expressed as $(V_0, V_1, \ldots, V_n)$, a may be expressed as $(a_1, a_2, \ldots, a_n)$, and n is a positive integer greater than 0. Each directed path from $V_0$ to $V_n$ corresponds to side marker $(a_1, a_2, \ldots, a_n)$ with length n, then all the side markers constitute all code words of a block code C based on A, and the code words may be in one-to-one correspondence with marking paths.

A minimum conventional Trellis graph of a linear code may be constituted by a corresponding generator matrix or a check matrix, the decoding algorithm based on the Trellis graph includes a Viterbi algorithm, the Viterbi algorithm adopts a maximum-likelihood decoding principle, and an output end receives a vector y, searches a code word having the maximum probability P(y|c) according to the maximum-likelihood decoding principle, finds n paths corresponding to a probability value P and uses the code words corresponding to the paths as decoded code words.

In the embodiment of the present disclosure, the code word maximizing the P value is searched according to the condition likelihood function formula, path search is carried out through the Trellis graph, a path corresponding to $P_{max}$ is found, and then the corresponding code word in the path is acquired.

As an optional implementation manner, in step S103, the decision value corresponding to the input mapping sequence is calculated according to the calculated Trellis path likelihood information corresponding to the input mapping sequence. Specifically, the input mapping sequence $u_1^N$ is estimated during the SC decoding, the decision value corresponding to the input mapping sequence is calculated, corresponding to the above condition likelihood function formula, if i⊂A, making $\hat{u}_i=L^{(i)}(y_1^N, \hat{u}_1^{i-1})$; and if i⊂$A^C$, making $\hat{u}_i=u_i$, and then the corresponding $\hat{u}_i$ is calculated.

As an optional implementation manner, in step S104, the decision value corresponding to the input mapping sequence is de-mapped according to the preset mapping relation, and the decoding sequence is obtained. As for the decision value corresponding to the input mapping sequence obtained in step S103, de-mapping is performed and the decoding sequence is obtained. For example, when m=2, the input mapping sequence may be set as a sequence composed of elements in (0, 1, α, $α^2$), the obtained decision values are de-mapped one by one according to the preset mapping relation 00~0, 01~1, 10~α and 11~$α^2$, and the decoding sequence is obtained.

According to the decoding method of the polar code provided by the embodiment of the present disclosure, Trellis path search may be carried out according to the receiving sequence and the check matrix, wherein the receiving sequence is output on the channel after the input mapping sequence is encoded, the decision value corresponding to the input mapping sequence is calculated, and the decision value corresponding to the input mapping sequence is de-mapped according to the preset mapping relation to obtain the decoding sequence. The input mapping sequence is a sequence obtained by mapping the input sequence according to the preset mapping relation, the input mapping sequence belongs to the finite field GF(q), q=$2^m$, m is a positive integer greater than 1, the receiving sequence is a sequence received from the channel after the input mapping sequence is encoded, when decoding the polar code, carrying out the Trellis path search, calculating the decision value and de-mapping, so as to simultaneously reduce a maximum list value and greatly reduce an average list value.

Figure 2:
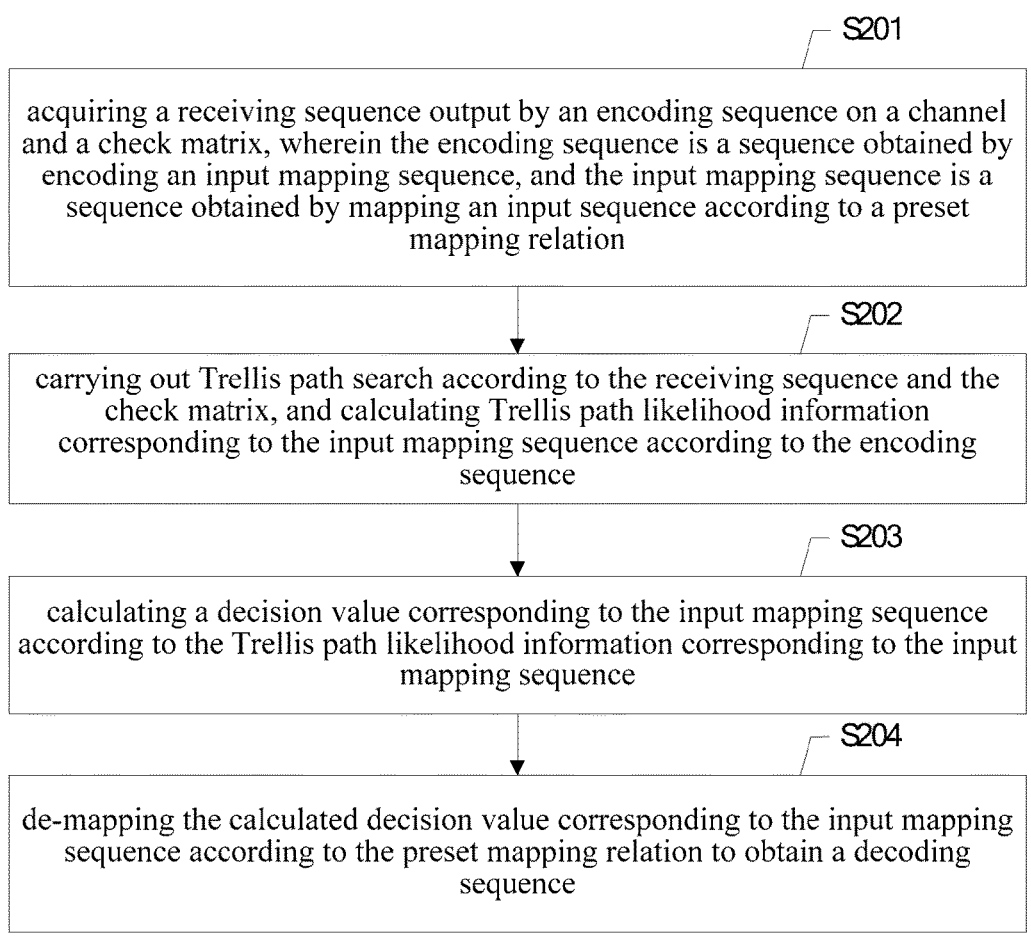
FIG. 2 is a flowchart of another decoding method of a polar code provided by an embodiment of the present disclosure.

Further optionally, as shown in FIG. 2, is a flowchart of another decoding method of a polar code provided by an embodiment of the present disclosure, wherein the decoding method of the polar code, shown in FIG. 2, is described from the angle of a decoding terminal, wherein the decoding terminal may be a mobile user equipment, a PC user equipment, a device serving global communication or other types of user equipment, and the specific implementation manner of the user equipment is not limited. As shown in FIG. 2, the decoding method of the polar code provided by the embodiment includes steps S201 to S204.

S201, acquiring a receiving sequence output by an encoding sequence on a channel and a check matrix, wherein the encoding sequence is a sequence obtained by encoding an input mapping sequence, and the input mapping sequence is a sequence obtained by mapping an input sequence according to a preset mapping relation.

S202, carrying out Trellis path search according to the receiving sequence and the check matrix, and calculating Trellis path likelihood information corresponding to the input mapping sequence according to the encoding sequence.

S203, calculating a decision value corresponding to the input mapping sequence according to the Trellis path likelihood information corresponding to the input mapping sequence.

S204, de-mapping the calculated decision value corresponding to the input mapping sequence according to the preset mapping relation to obtain a decoding sequence.

As an optional implementation manner, in step S201, the input mapping sequence is a sequence obtained by mapping the input sequence according to the preset mapping relation, each information bit in the input sequence may be 0 or 1, specifically, the input mapping sequence is a symbol set which belongs to a finite field GF(q) and includes a plurality of input mapping values, wherein q=$2^m$, m is a positive integer greater than 1, and optionally, the preset mapping relation may include: correspondingly mapping every m bits in the input sequence to each input mapping value.

If m=2, every 2 bits in the input sequence are correspondingly mapped to each input mapping value, the preset mapping relation must satisfy: every m bits in the input sequence are correspondingly mapped to each input mapping value, a specific mapping corresponding value may be set in a self-defining manner, for example, the input mapping sequence may be set as a sequence composed of elements in (0, 1, α, $α^2$), the preset mapping relation may be: 00~0, 01~1, 10~α, 11~$α^2$, further optionally, the preset mapping relation may be: 00~0, 11~1, 01~α, 10~$α^2$, the preset mapping relation may be set in the self-defining manner, and the specific preset mapping relation is not limited to the embodiment of the present disclosure.

Further optionally, the input mapping sequence may be set as a sequence composed of elements in (0, 1, α, $α^2$) and may also be set as a sequence composed of elements in (0, 1, β, $β^2$), or a sequence composed of elements in (η, $η^2$, $η^3$, $η^4$), the specific input mapping value contained in the input mapping sequence may be set in the self-defining manner, in the embodiment of the present disclosure, it is taken as an example for description that the input mapping sequence is a sequence composed of elements in (0, 1, α, $α^2$), and the expression of the specific input mapping value is not limited to the embodiment of the present disclosure.

If m=3, every 3 bits in the input sequence are correspondingly mapped to each input mapping value, for example, the input mapping sequence may be set as a sequence composed of elements in (0, 1, $\alpha$, $\alpha^2$, $\alpha^3$, $\alpha^4$, $\alpha^5$, $\alpha^6$), and the preset mapping relation may be: 000~0, 001~1, 010~$\alpha$, 011~$\alpha^2$, 100~$\alpha^3$, 101~$\alpha^4$, 110~$\alpha^5$, 111~$\alpha^6$.

As an optional implementation manner, in step S202, the encoding sequence is a sequence obtained by encoding the input mapping sequence. Further optionally, a parameter of polar code may be set as (N, K, A, $u_{A^C}$), wherein A refers to a set of information bit indexes, $A^C$ refers to a complementary set of A, K refers to a number of elements in A, $u_{A^C}$ refers to frozen bits with a number of (N−K), and the frozen bits are generally set as 0. Specifically, the encoding formula is:

$$x_1^N = u_1^N G_N, \quad \text{(formula 1-1)}$$

the encoding sequence is obtained by $x_1^N$ through an encoding channel, wherein $u_1^N$ refers to the input mapping sequence, $G_N$ refers to a preset N-order generator matrix, $G_N = B_N F^{\otimes n}$, $B_N$ refers to a permutation matrix, $F^{\otimes n}$ refers to a Kronecker power, $F^{\otimes n} = F \otimes F^{\otimes(n-1)}$, N refers to a code length, $N = m 2^m$, $n \geq 0$, wherein, the symbol $\otimes$ refers to a tensor product of matrix, and the tensor product of matrix refers to a method for expanding the vector space of a matrix to a higher order vector space.

Further optionally, the input mapping sequence is a symbol set which belongs to a finite field GF(q) and includes a plurality of input mapping values, $q = 2^m$, and m is a positive integer greater than 1. If m=2, the input mapping sequence may be expressed as a sequence composed of elements in (0, 1, $\alpha$, $\alpha^2$), the preset N-order generator matrix may be expressed as $G_4 = B_4 F_{RS4}^{\otimes n}$, wherein, $$F_{RS4} = \begin{pmatrix} 1 & 1 & 1 & 0 \\ \alpha & \alpha^2 & 1 & 0 \\ \alpha^2 & \alpha & 1 & 0 \\ 1 & 1 & 1 & \alpha \end{pmatrix}.$$

Further optionally, the input mapping sequence is a symbol set which belongs to a finite field GF(q) and includes a plurality of input mapping values, $q = 2^m$, and m is a positive integer greater than 1. If m=3, the input mapping sequence may be expressed as a sequence composed of elements in (0, 1, $\alpha$, $\alpha^2$, $\alpha^3$, $\alpha^4$, $\alpha^5$, $\alpha^6$), the preset N-order generator matrix may be expressed as $G_8 = B_8 F_{RS8}^{\otimes n}$, wherein, $$F_{RS8} = \begin{pmatrix} 1 & 1 & 1 & 1 & 1 & 1 & 1 & 0 \\ \alpha & \alpha^2 & \alpha^3 & \alpha^4 & \alpha^5 & \alpha^6 & 1 & 0 \\ \alpha^2 & \alpha^4 & \alpha^6 & \alpha^1 & \alpha^3 & \alpha^5 & 1 & 0 \\ \alpha^3 & \alpha^6 & \alpha^2 & \alpha^5 & \alpha^1 & \alpha^4 & 1 & 0 \\ \alpha^4 & \alpha^1 & \alpha^5 & \alpha^2 & \alpha^6 & \alpha^3 & 1 & 0 \\ \alpha^5 & \alpha^3 & \alpha^1 & \alpha^6 & \alpha^4 & \alpha^2 & 1 & 0 \\ \alpha^6 & \alpha^5 & \alpha^4 & \alpha^3 & \alpha^2 & \alpha^1 & 1 & 0 \\ 1 & 1 & 1 & 1 & 1 & 1 & 1 & \alpha \end{pmatrix}.$$

As an optional implementation manner, in step S201, the receiving sequence output by the encoding sequence on the channel and the check matrix are obtained. In the embodiment of the present disclosure, an encoding sequence y' is obtained through an encoding channel W by $x_1^N$ calculated by the encoding formula, and y' is transmitted in a physical medium channel, wherein the physical medium channel may be a wireless channel and may also be a wired channel, for simple expression, it is assumed in the embodiment of the present disclosure that the channel is an additive white Gaussian noise channel, y' and white Gaussian noise are transmitted to the decoding terminal, and the decoding terminal receives the sequence, namely receives the receiving sequence, which is marked as y. In the embodiment of the present disclosure, the receiving sequence y is decoded. The check matrix is a matrix set by the decoding terminal for check according to the input mapping sequence when decoding.

Further optionally, the input mapping sequence is a symbol set which belongs to a finite field GF(q) and includes a plurality of input mapping values, $q = 2^m$, and m is a positive integer greater than 1. If m=2, the input mapping sequence may be expressed as a sequence composed of elements in (0, 1, $\alpha$, $\alpha^2$), the check matrix may include a first check matrix and a second check matrix, wherein the first check matrix may be expressed as $H_{01} = (1 \ 1 \ 1 \ \alpha^2)$; and the second check matrix may be expressed as $$H_{02} = \begin{pmatrix} 1 & 1 & 1 & \alpha^2 \\ \alpha & \alpha^2 & 0 & \alpha^2 \end{pmatrix}.$$

Further optionally, the input mapping sequence is a symbol set which belongs to a finite field GF(q) and includes a plurality of input mapping values, $q = 2^m$, and m is a positive integer greater than 1. If m=3, the input mapping sequence may be expressed as a sequence composed of elements in (0, 1, $\alpha$, $\alpha^2$, $\alpha^3$, $\alpha^4$, $\alpha^5$, $\alpha^6$), the check matrix may include a third check matrix, a fourth check matrix, a fifth check matrix and a sixth check matrix, wherein the third check matrix may be expressed as $H_{001} = (1 \ 1 \ 1 \ 1 \ 1 \ 1 \ 1 \ \alpha^6)$;

the fourth check matrix may be expressed as $$H_{002} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \end{pmatrix};$$

the fifth check matrix may be expressed as $$H_{003} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \end{pmatrix};$$

and
the sixth check matrix may be expressed as $$H_{004} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \\ \alpha^4 & \alpha^1 & \alpha^5 & \alpha^2 & \alpha^6 & \alpha^3 & 1 & 0 \end{pmatrix}.$$

As an optional implementation manner, in step S202, the Trellis path search is carried out according to the receiving sequence and the check matrix, and the Trellis path likelihood information corresponding to the input mapping sequence is calculated according to the encoding sequence. In the embodiment of the present disclosure, the Trellis path likelihood information corresponding to the input mapping sequence may be calculated according to a condition likelihood function formula, for example, the condition likelihood function formula is:

$$L^{(i)}(y_1^N, \hat{u}_1^{i-1}) = (u_i \in GF(q))^{argmax} P_{u_i/U_1^{i-1}, Y_1^N}(u_i/\hat{u}_1^{i-1}, y_1^N),$$ (formula 1-2)

wherein, $y_1^N$ refers to the receiving sequence, $u_1^N$ and $y_1^N$ satisfy probability distribution:

$$P_{U_1^N, Y_1^N}(u_1^N, y_1^N) = \frac{1}{q^N} W^N(y_1^N / u_1^N G_N).$$

$y_1^N$ expresses the receiving sequence $(y_1, y_2, y_3, \ldots, y_N)$, $u_1^N$ expresses the input mapping sequence $(u_1, u_2, \ldots, u_N)$, and $W^N(y_1^N/u_1^N G_N)$ expresses the probability of receiving $y_1^N$ when sending $u_1^N G_N$ in a binary channel.

As an optional implementation manner, in step S203, the decision value corresponding to the input mapping sequence is calculated according to the calculated Trellis path likelihood information corresponding to the input mapping sequence. Specifically, the input mapping sequence $u_1^N$ is estimated during the SC decoding, the decision value corresponding to the input mapping sequence is calculated, corresponding to the above condition likelihood function formula (formula 1-2), if $i \subset A$, making $\hat{u}_i = L^{(i)}(y_1^N, \hat{u}_1^{i-1})$; and if $i \subset A^C$, making $\hat{u}_i = u_i$, and then the corresponding $\hat{u}_i$ is calculated.

As an optional implementation manner, in step S204, the calculated decision value corresponding to the input mapping sequence is de-mapped according to the preset mapping relation, and the decoding sequence is obtained. As for the decision value corresponding to the input mapping sequence obtained in step S203, de-mapping is performed and the decoding sequence is obtained. For example, when m=2, the input mapping sequence may be set as a sequence composed of elements in $(0, 1, \alpha, \alpha^2)$, the obtained decision values are de-mapped one by one according to the preset mapping relation 00~0, 01~1, 10~$\alpha$ and 11~$\alpha^2$, and the decoding sequence is obtained.

Further optionally, the input mapping sequence is a symbol set which belongs to a finite field GF(q) and includes a plurality of input mapping values, $q=2^m$, m is a positive integer greater than 1, and the decoding process of the polar code will be described below in detail with m=2 as an example.

Figure 3:
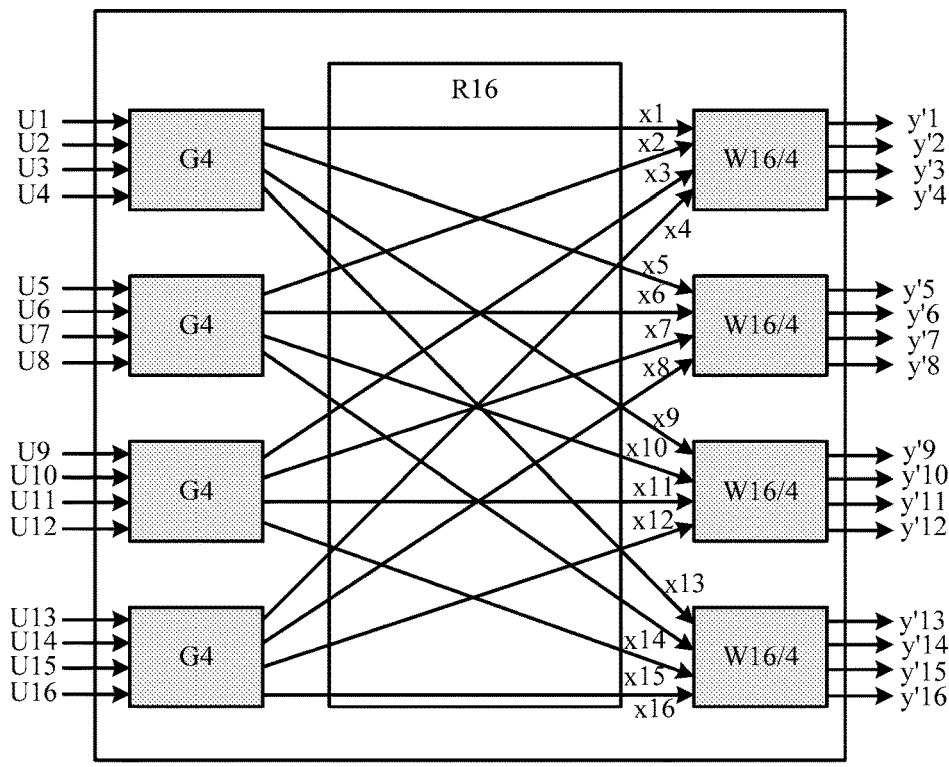
FIG. 3 is a schematic diagram of a channel combining process of a polar code provided by an embodiment of the present disclosure.

As an optional implementation manner, the polar code is a channel encoding method based on a channel polarization theory, a channel polarization process includes channel combining and channel splitting, the channel combining refers to copying the known channel W to obtain $W_N$, and the channel splitting refers to a process of restoring the $W_N$ to N mutually independent channels. As shown in FIG. 3, is a schematic diagram of a channel combining process of a polar code provided by an embodiment of the present disclosure, the input mapping sequence corresponding to the schematic diagram of the channel combining process of the polar code belongs to a finite field GF(4), namely, $q=2^m$, m=2, the code length $N=2^4=16$, the receiving sequence $y_1^{16}$ is $(y_1, y_2, \ldots, y_{16})$, the input mapping sequence $u_1^{16}$ is $(u_1, u_2, \ldots, u_{16})$, $x_1^{16}$ may be expressed as $(x_1, x_2, \ldots, x_{16})$, and the encoding sequence $y_1^{16'}$ may be expressed as $(y_1', y_2', \ldots, y_{16}')$. As shown in FIG. 3, the encoding sequence $y_1^{16'}$ is obtained by $x_1^{16}$ passing through the encoding channel $W_{16/4}$, $y_1^{16'}$ is transmitted in the physical medium channel, and the sequence received by the decoding terminal is the receiving sequence $y_1^{16}$, for simple expression, it is assumed in the embodiment of the present disclosure that the channel is an additive white Gaussian noise channel, wherein, $y_1^{16}=y_1^{16'}+$noise, noise refers to additive white Gaussian noise (AWGN), and in the embodiment of the present disclosure, the receiving sequence $y_1^{16}$ is decoded. In combination with the channel combining process as shown in FIG. 3, a likelihood function value is calculated according to the condition likelihood function formula (formula 1-2), and the following decoding process may be obtained:

(1) calculating likelihood function values of $x_1$, $x_5$, $x_9$ and $x_{13}$ respectively according to the condition likelihood function formula 1-1 through Trellis path search, in accordance with a receiving vector $y_1^{16}$ and a first check matrix $H_{01}$, wherein $H_{01}=(1\ 1\ 1\ \alpha^2)$.

(2) calculating the likelihood function value of $u_1$ according to the likelihood function values of $x_1$, $x_5$, $x_9$ and $x_{13}$ and the check matrix $H_{01}$ through the Trellis path search, and calculating a decision value $\hat{u}_1$ corresponding to $u_1$.

(3) calculating the likelihood function value of $u_2$ according to the likelihood function values of $x_1$, $x_5$, $x_9$ and $x_{13}$, the $\hat{u}_1$ and a check matrix $H_{02}$ through the Trellis path search, and calculating a decision value $\hat{u}_2$ corresponding to $u_2$, wherein, $$H_{02} = \begin{pmatrix} 1 & 1 & 1 & \alpha^2 \\ \alpha & \alpha^2 & 0 & \alpha^2 \end{pmatrix}.$$

(4) calculating the likelihood function values of $u_3$ and $u_4$ according to the likelihood function values of $x_1$, $x_5$, $x_9$ and $x_{13}$, $\hat{u}_1$, $\hat{u}_2$ and a generator matrix $G_4$, and calculating decision values $\hat{u}_3$ and $\hat{u}_4$ corresponding to $u_3$ and $u_4$ respectively.

(5) calculating decision values $\hat{x}_1$, $\hat{x}_5$, $\hat{x}_9$, $\hat{x}_{13}$ corresponding to $x_1$, $x_5$, $x_9$ and $x_{13}$ respectively according to the decision values $\hat{u}_1$, $\hat{u}_2$, $\hat{u}_3$ and $\hat{u}_4$ and the generator matrix $G_4$.

(6) calculating the likelihood function values of $x_2$, $x_6$, $x_{10}$ and $x_{14}$ respectively according to the receiving sequence $y_1^{16}$, the decision values $\hat{x}_1$, $\hat{x}_5$, $\hat{x}_9$, $\hat{x}_{13}$ and the check matrix $H_{02}$ through the Trellis path search.

(7) calculating the likelihood function value of $u_5$ according to the likelihood function values of $x_2$, $x_6$, $x_{10}$, $x_{14}$ and the check matrix $H_{01}$ through the Trellis path search, and calculating a decision value $\hat{u}_5$ corresponding to $u_5$.

(8) calculating the likelihood function value of $u_6$ according to the likelihood function values of $x_2$, $x_6$, $x_{10}$, $x_{14}$, the decision value $\hat{u}_5$ and the check matrix $H_{02}$ through the Trellis path search, and calculating a decision value $\hat{u}_6$ corresponding to $u_6$.

(9) calculating the likelihood function values of $u_7$, $u_8$ according to the likelihood function values of $x_2$, $x_6$, $x_{10}$, $x_{14}$, the decision values $\hat{u}_5$, $\hat{u}_6$ and the generator matrix $G_4$, and calculating decision values $\hat{u}_7$, $\hat{u}_8$ corresponding to $u_7$, $u_8$ respectively.

(10) calculating decision values $\hat{x}_2$, $\hat{x}_6$, $\hat{x}_{10}$ and $\hat{x}_{14}$ corresponding to $x_2$, $x_6$, $x_{10}$ and $x_{14}$ respectively according to the decision values $\hat{u}_5$, $\hat{u}_6$, $\hat{u}_7$, and $\hat{u}_8$ and the generator matrix $G_4$.

(11) calculating the likelihood function values of $x_3$, $x_7$, $x_{11}$, $x_{15}$ respectively according to the receiving sequence $y_1^{16}$, the decision values $\hat{x}_2$, $\hat{x}_6$, $\hat{x}_{10}$ and $\hat{x}_{14}$ and the check matrix $H_{02}$ through the Trellis path search.

(12) calculating the likelihood function value of $u_9$ according to the likelihood function values of $x_3$, $x_7$, $x_{11}$, $x_{15}$ and the check matrix $H_{01}$ through the Trellis path search, and calculating a decision value $\hat{u}_9$ corresponding to $u_9$.

(13) calculating the likelihood function value of $u_{10}$ according to the likelihood function values of $x_3$, $x_7$, $x_{11}$, $x_{15}$, the decision value $\hat{u}_9$ and the check matrix $H_{02}$ through the Trellis path search, and calculating a decision value $\hat{u}_{10}$ corresponding to $u_{10}$.

(14) calculating the likelihood function values of $u_{11}$, $u_{12}$ according to the likelihood function values of $x_3$, $x_7$, $x_{11}$, $x_{15}$, the decision values $\hat{u}_9$, $\hat{u}_{10}$ and the generator matrix $G_4$, and calculating decision values $\hat{u}_{11}$, $\hat{u}_{12}$ corresponding to $u_{11}$, $u_{12}$ respectively.

(15) calculating decision values $\hat{x}_3$, $\hat{x}_7$, $\hat{x}_{11}$ and $x_{15}$ corresponding to $x_3$, $x_7$, $x_{11}$, $x_{15}$, respectively according to the decision values $\hat{u}_9$, $\hat{u}_{10}$, $\hat{u}_{11}$, $\hat{u}_{12}$ and the generator matrix $G_4$.

(16) calculating the likelihood function values of $x_4$, $x_8$, $x_{12}$, $x_{16}$ respectively according to the receiving sequence $y_1^{16}$, the decision values $\hat{x}_3$, $\hat{x}_7$, $\hat{x}_{11}$ and $\hat{x}_{15}$ and the check matrix $H_{02}$ through the Trellis path search.

(17) calculating the likelihood function value of $u_{13}$ according to the likelihood function values of $x_4$, $x_8$, $x_{12}$, $x_{16}$ and the check matrix $H_{01}$ through the Trellis path search, and calculating a decision value $\hat{u}_{13}$ corresponding to $u_{13}$.

(18) calculating the likelihood function value of $u_{14}$ according to the likelihood function values of $x_4$, $x_8$, $x_{12}$, $x_{16}$, the decision value $\hat{u}_{13}$ and the check matrix $H_{02}$ through the Trellis path search, and calculating a decision value $\hat{u}_{14}$ corresponding to $u_{14}$.

(19) calculating the likelihood function values of $u_{15}$, $u_{16}$ according to the likelihood function values of $x_4$, $x_8$, $x_{12}$, $x_{16}$, the decision values $\hat{u}_{13}$, $\hat{u}_{14}$ and the generator matrix $G_4$, and calculating decision values $\hat{u}_{15}$, $\hat{u}_{16}$ corresponding to $u_{15}$, $u_{16}$ respectively.

(20) calculating decision values $\hat{x}_4$, $\hat{x}_8$, $\hat{x}_{12}$ and $\hat{x}_{16}$ corresponding to $x_4$, $x_8$, $x_{12}$, $x_{16}$ respectively according to the decision values $\hat{u}_{13}$, $\hat{u}_{14}$, $\hat{u}_{15}$, $\hat{u}_{16}$ and the generator matrix $G_4$.

The obtained decision value corresponding to the input mapping sequence $u_1^{16}$ is $(\hat{u}_1, \hat{u}_2, \ldots, \hat{u}_{16})$, and then de-mapping is performed according to the preset mapping relation to obtain the decoding sequence.

Further optionally, the decoding process of the polar code is described above when the input mapping sequence belongs to the finite field GF(q), $q=2^m$, and $m=2$, m is a positive integer greater than 1, when $m=3$, the decoding process and steps refer to the decoding process and steps when $m=2$ described above, and will not be repeated herein, wherein the input mapping sequence may be expressed as a sequence composed of elements in $(0, 1, \alpha, \alpha^2, \alpha^3, \alpha^4, \alpha^5, \alpha^6)$, the check matrix may include a third check matrix, a fourth check matrix, a fifth check matrix and a sixth check matrix, wherein the third check matrix may be expressed as:

$H_{001} = (1\ 1\ 1\ 1\ 1\ 1\ 1\ \alpha^6)$;

the fourth check matrix may be expressed as:

$$H_{002} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \end{pmatrix};$$

the fifth check matrix may be expressed as:

$$H_{003} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \end{pmatrix};$$

and
the sixth check matrix may be expressed as:

$$H_{004} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \\ \alpha^4 & \alpha^1 & \alpha^5 & \alpha^2 & \alpha^6 & \alpha^3 & 1 & 0 \end{pmatrix}.$$

When m>3, the decoding process and steps refer to the decoding process and steps when m=2 described above, and will not be repeated herein.

Further optionally, a decoding result of the polar code provided by the embodiment of the present disclosure is simulated, and the simulation result will be described below in detail by examples.

Figure 4A:
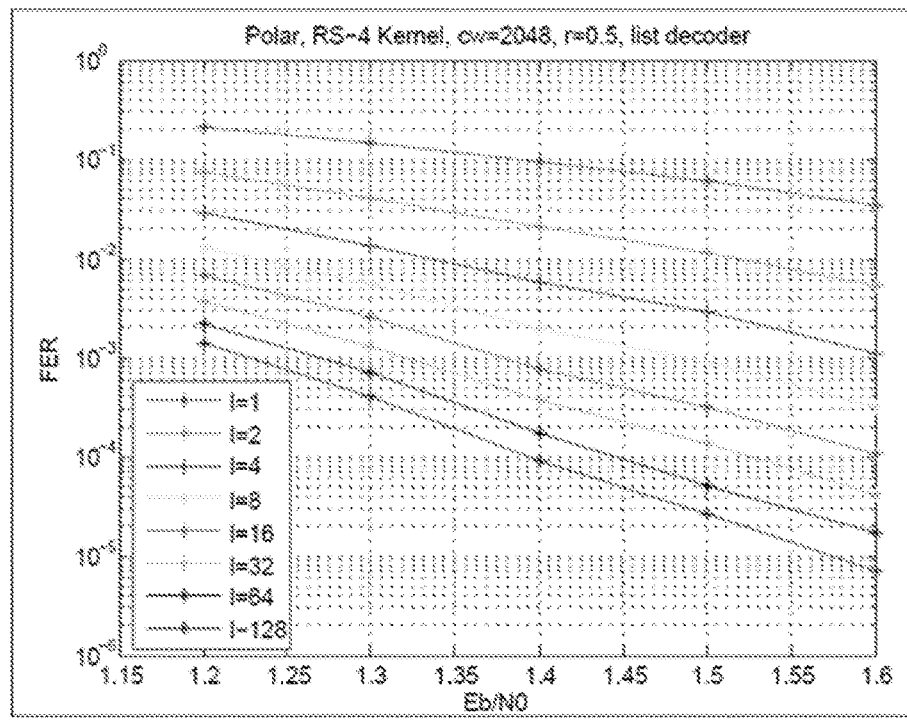
FIG. 4a is a schematic diagram of a decoding simulation result of a polar code provided by an embodiment of the present disclosure.

As an optional implementation manner, the obtained decoding result of the decoding process of the polar code when m=2 is simulated, as shown in FIG. 4a, is a schematic diagram of a decoding simulation result of a polar code provided by an embodiment of the present disclosure. FIG. 4(a) is a schematic diagram of the simulation result when the input mapping sequence belongs to a finite field GF(4), namely, $q=2^m$, m=2, the code length N=2048, and the code rate is 0.5, wherein, the horizontal axis refers to Eb/No, the vertical axis refers to FER, and 8 curves from top to bottom in total respectively correspond to corresponding simulation result curves when list=1, list=2, list=4, list=8, list=16, list=32, list=64, and list=128.

In the conventional art, encoding and decoding are carried out in a GF(2) field. Encoding is carried out via polar code cascading CRC, the original k bits used for transmitting information bits are divided into two parts, k-r bits are used for transmitting information, and the rest r bits are used for carrying out r-bit CRC check on the previous k-r bits. When performing SCL decoding, the CRC check is carried out on each survival path, and if at least one survival path in all list survival paths may pass the CRC check, a path having the maximum likelihood function is selected from the survival paths passing the CRC check; and otherwise, the path having the maximum likelihood function is selected from all list survival paths to serve as a decision path. The number of decoded list layers of each encoding code word is not constant, all encoding code words share list resources, the CRC check is carried out on each branch to decide whether stopping searching the survival path or not, if the CRC check is passed, the search on the survival path is stopped, and otherwise, the list value is increased to continue the search.

It can be seen from FIG. 4(a) that, when the abscissa is 1.2, the corresponding maximum list value is 128 and the average list value is 1.75; when the abscissa is 1.6, the corresponding maximum list value is 128 and the average list value is 1.06. The simulation result of the embodiment of the present disclosure is compared with the simulation result in the conventional art and correlation data may be obtained, shown in the following table as an example:

| Eb/N0 | | Conventional art | Embodiment of the present disclosure GF(4) |
|---|---|---|---|
| 1.2 | maximum list | 8192 | 128 |
|  | average list | 52.59 | 1.75 |
| 1.6 | maximum list | 8192 | 128 |
|  | average list | 2.47 | 1.06 |

It can be seen from the correlation data in the above table that, the embodiment of the present disclosure is implemented to simultaneously reduce the maximum list value and greatly reduce the average list value.

Figure 4B:
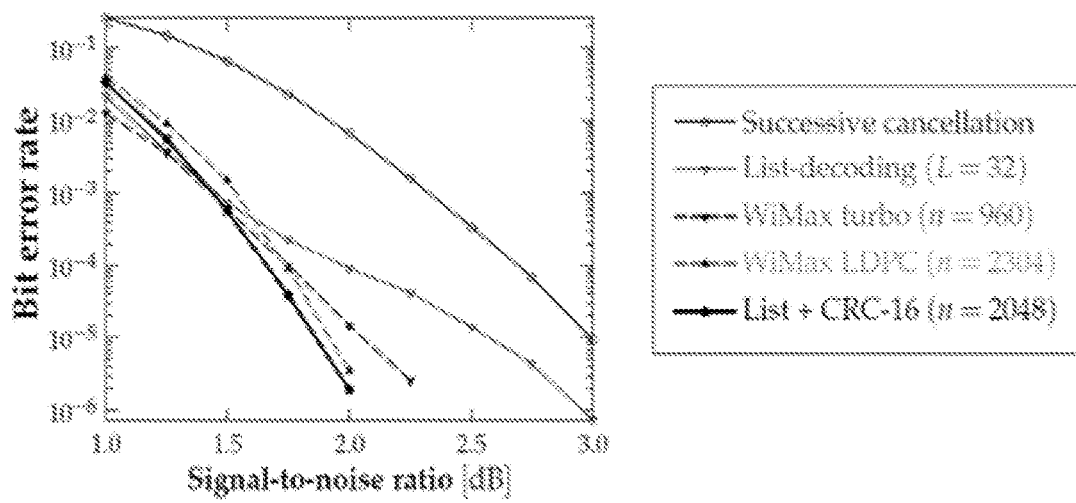
FIG. 4b is a schematic diagram of a decoding simulation result of a polar code in the conventional art.

As shown in FIG. 4b, it is a schematic diagram of a decoding simulation result of a polar code in the conventional art. FIG. 4(b) is a schematic curve diagram of the simulation result in the conventional art, the horizontal axis refers to Eb/No, the vertical axis refers to FER, FIG. 4(b) is the schematic diagram of the simulation result when the input mapping sequence belongs to a finite field GF(2), and the code length N=2048, and there are 5 curves in FIG. 4(b) in total, taking the crossover points of the curves with the vertical axis as sequences, the curves are respectively as follows from top to bottom: curve 1: a continuous curve, curve 2: the code length=2304, curve 3: the code length=2048, curve 4: list=32, and curve 5: the code length=960. It can be seen from the curve 3 in FIG. 4(b) that, when FER=$10^{-3}$, the corresponding Eb/No=1.6 dB. It can be seen from FIG. 4(a) that, when Lmax=32 and FER=$10^{-3}$, Eb/No=1.32 dB, therefore, the embodiment of the present disclosure may be implemented to reduce the list value.

Figure 4C:
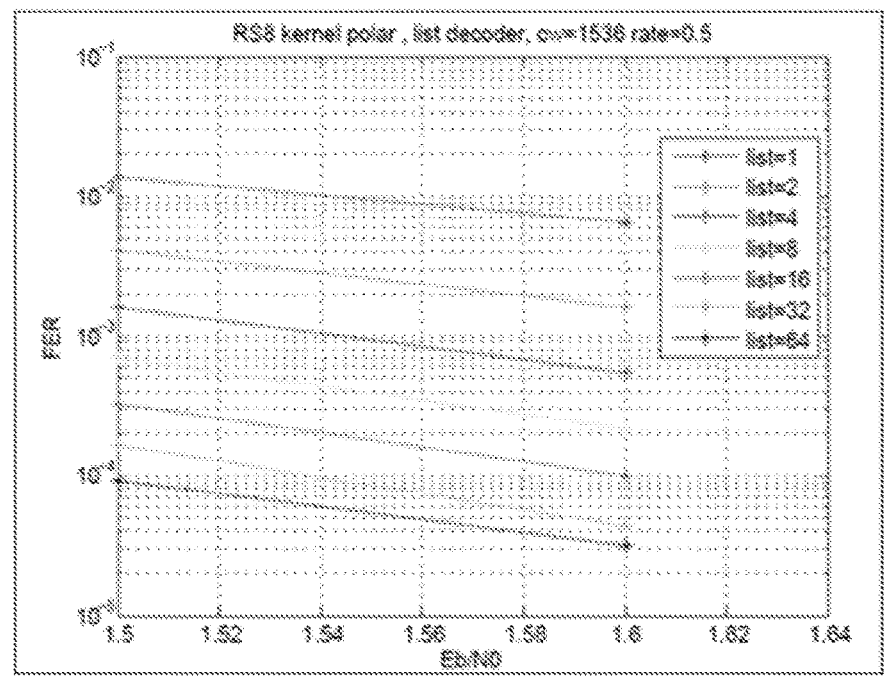
FIG. 4c is a schematic diagram of another decoding simulation result of a polar code provided by an embodiment of the present disclosure.

As shown in FIG. 4c, is a schematic diagram of another decoding simulation result of a polar code provided by an embodiment of the present disclosure. FIG. 4(c) is a schematic diagram of the simulation result when the input mapping sequence belongs to a finite field GF(8), namely, q=$2^m$, m=3, the code length N=1536, and the code rate is 0.5, wherein, the horizontal axis refers to Eb/No, the vertical axis refers to FER, the curve expresses a list value, it can be seen from FIG. 4(c) that although the code length is only 1536, when Lmax=4, and Eb/No=1.54 dB, FER=$10^{-3}$ may be achieved, so that the maximum list value is greatly reduced.

Based on the above simulation result, it can be seen that, the embodiment of the present disclosure may be used for simultaneously reducing the maximum list value and greatly reducing the average list value.

Further optionally, by means of the simulation of the embodiment of the present disclosure, the embodiment of the present disclosure may further increase the minimum Hamming distance of the polar code.

According to the decoding method of the polar code provided by the embodiment of the present disclosure, the input sequence may be mapped according to the preset mapping relation to obtain the input mapping sequence, the input mapping sequence is encoded to obtain the encoding sequence, the encoding sequence is transmitted on the channel and the receiving sequence is output, the Trellis path search may be carried out according to the receiving sequence and the check matrix, the decision value corresponding to the input mapping sequence is calculated, and the decision value corresponding to the input mapping sequence is de-mapped according to the preset mapping relation, and the decoding sequence is obtained.

The input mapping sequence is a sequence obtained by mapping the input sequence according to the preset mapping relation, the input mapping sequence belongs to the finite field GF(q), q=$2^m$, m is a positive integer greater than 1, the receiving sequence is a sequence received from the channel after the input mapping sequence is encoded, when decoding the polar code, the Trellis path search is carried out, the decision value is calculated and de-mapping is performed to simultaneously reduce the maximum list value and greatly reduce the average list value.

Specifically, it can be seen from the comparison of the simulation result corresponding to the decoding method of the polar code provided by the embodiment of the present disclosure and the decoding simulation result of the polar code in the conventional art that, the maximum list size of decoding is greatly reduced, and when the input mapping sequence belongs to the finite field GF(4), the code length is 2048, the code rate is 0.5 and FER=$10^{-3}$, the maximum list size is 1.5% of the conventional art; the average list size is greatly reduced; and when the input mapping sequence belongs to the finite field GF(4), the code length is 2048, the code rate is 0.5 and Eb/No=1.2, the average list size is 3.3% of the conventional art.

By adopting the embodiment of the present disclosure, the maximum list size may be greatly reduced, the user experience is improved, the hardware implementation cost is saved, fixed logic resources are configured for the maximum list size on the premise of guaranteeing a total frame error ratio to improve the degree of parallelism, and the embodiment of the present disclosure reduces the maximum list size, so as to reduce the occupancy volume of total logic resources.

The decoding apparatus of the polar code provided by the embodiment of the present disclosure will be introduced below in detail in combination with FIG. 5.

Figure 5:
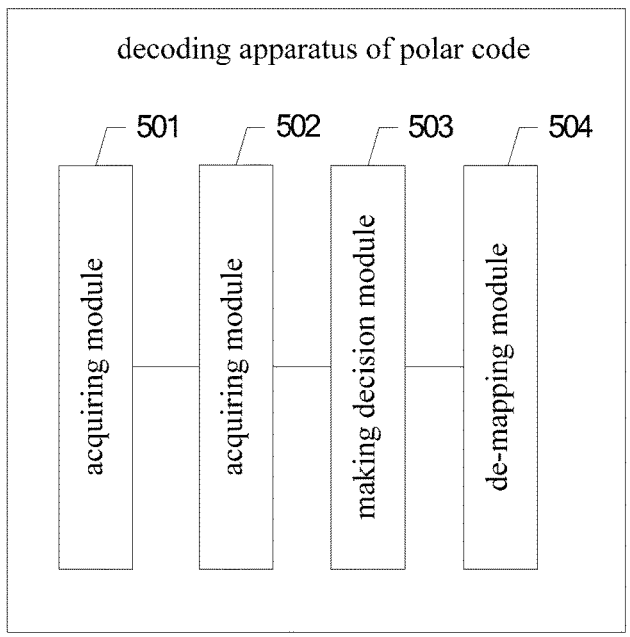
FIG. 5 is a structure diagram of a decoding apparatus of a polar code provided by an embodiment of the present disclosure.

Please refer to FIG. 5, is a structure diagram of a decoding apparatus of a polar code provided by an embodiment of the present disclosure. It should be noted that, the decoding apparatus of the polar code as shown in FIG. 5 is used for executing the method of the embodiments as shown in FIG. 1 and FIG. 2 in the present disclosure, for convenience of illustration, only the parts related to the embodiments of the present disclosure are shown, and for undisclosed specific technical details, please refer to the embodiments as shown in FIG. 1 and FIG. 2 in the present disclosure.

As an optional implementation manner, the decoding apparatus of the polar code provided by the embodiment of the present disclosure may be a decoding terminal, wherein the decoding terminal may be a mobile user equipment, a PC user equipment, a device serving global communication or other types of user equipment, and the specific implementation manner of the user equipment is not limited.

As shown in FIG. 5, the apparatus may include an acquiring module 501, a path processing module 502, a making decision module 503 and a de-mapping module 504.

The acquiring module 501 is configured to acquire a receiving sequence and a check matrix, wherein the receiving sequence is output on a channel after an input mapping sequence is encoded.

The path processing module 502 is configured to carry out Trellis path search according to the acquired receiving sequence and the check matrix, and calculate Trellis path likelihood information corresponding to the input mapping sequence.

The making decision module 503 is configured to calculate a decision value corresponding to the input mapping sequence according to the calculated Trellis path likelihood information corresponding to the input mapping sequence.

The de-mapping module 504 is configured to de-map the calculated decision value corresponding to the input mapping sequence according to a preset mapping relation to obtain a decoding sequence.

As an optional implementation manner, the input mapping sequence is a sequence obtained by mapping the input sequence according to the preset mapping relation, each information bit in the input sequence may be 0 or 1, specifically, the input mapping sequence is a symbol set which belongs to a finite field GF(q) and includes a plurality of input mapping values, wherein $q=2^m$, m is a positive integer greater than 1, and optionally, the preset mapping relation may include: correspondingly mapping every m bits in the input sequence to each input mapping value.

If m=2, every 2 bits in the input sequence are correspondingly mapped to each input mapping value, the preset mapping relation must satisfy: every m bits in the input sequence are correspondingly mapped to each input mapping value, a specific mapping corresponding value may be set in a self-defining manner, for example, the input mapping sequence may be set as a sequence composed of elements in (0, 1, $\alpha$, $\alpha^2$), the preset mapping relation may be: 00~0, 01~1, 10~$\alpha$, 11~$\alpha^2$, further optionally, the preset mapping relation may be: 00~0, 11~1, 01~$\alpha$, 10~$\alpha^2$, the preset mapping relation may be set in the self-defining manner, and the specific preset mapping relation is not limited to the embodiment of the present disclosure.

Further optionally, the input mapping sequence may be set as a sequence composed of elements in (0, 1, $\alpha$, $\alpha^2$) and may also be set as a sequence composed of elements in (0, 1, $\beta$, $\beta^2$), or a sequence composed of elements in ($\eta$, $\eta^2$, $\eta^3$, $\eta^4$), the specific input mapping value contained in the input mapping sequence may be set in the self-defining manner, in the embodiment of the present disclosure, it is taken as an example for description that the input mapping sequence is a sequence composed of elements in (0, 1, $\alpha$, $\alpha^2$), and the expression of the specific input mapping value is not limited to the embodiment of the present disclosure.

If m=3, every 3 bits in the input sequence are correspondingly mapped to each input mapping value, for example, the input mapping sequence may be set as a sequence composed of elements in (0, 1, $\alpha$, $\alpha^2$, $\alpha^3$, $\alpha^4$, $\alpha^5$, $\alpha^6$), and the preset mapping relation may be: 000~0, 001~1, 010~$\alpha$, 011~$\alpha^2$, 100~$\alpha^3$, 101~$\alpha^4$, 110~$\alpha^5$, 111~$\alpha^6$.

As an optional implementation manner, the encoding sequence is a sequence obtained by encoding the input mapping sequence. Further optionally, a parameter of polar code may be set as (N, K, A, $u_{A^C}$), wherein A refers to a set of information bit indexes, $A^C$ refers to a complementary set of A, K refers to a number of elements in A, $u_{A^C}$ refers to frozen bits with a number of (N−K), and the frozen bits are generally set as 0. Specifically, the encoding formula is:

$$x_1^N = u_1^N G_N, \quad \text{(formula 1-1)}$$

the encoding sequence is obtained by $x_1^N$ through an encoding channel, wherein $u_1^N$ refers to the input mapping sequence, $G_N$ refers to a preset N-order generator matrix, $G_N = B_N F^{\otimes n}$, $B_N$ refers to a permutation matrix, $F^{\otimes n}$ refers to a Kronecker power, $F^{\otimes n} = F \otimes F^{\otimes (n-1)}$, N refers to a code length, $N = m 2^{mn}$, $n \geq 0$, wherein, the symbol $\otimes$ refers to a tensor product of matrix, and the tensor product of matrix refers to a method for expanding the vector space of a matrix to a higher order vector space.

Further optionally, the input mapping sequence is a symbol set which belongs to a finite field GF(q) and includes a plurality of input mapping values, $q=2^m$, and m is a positive integer greater than 1. If m=2, the input mapping sequence may be expressed as a sequence composed of elements in (0, 1, $\alpha$, $\alpha^2$), the preset N-order generator matrix may be expressed as $G_4 = B_4 F_{RS4}^{\otimes n}$, wherein, $$F_{RS4} = \begin{pmatrix} 1 & 1 & 1 & 0 \\ \alpha & \alpha^2 & 1 & 0 \\ \alpha^2 & \alpha & 1 & 0 \\ 1 & 1 & 1 & \alpha \end{pmatrix}.$$

Further optionally, the input mapping sequence is a symbol set which belongs to a finite field GF(q) and includes a plurality of input mapping values, $q=2^m$, and m is a positive integer greater than 1. If m=3, the input mapping sequence may be expressed as a sequence composed of elements in (0, 1, $\alpha$, $\alpha^2$, $\alpha^3$, $\alpha^4$, $\alpha^5$, $\alpha^6$), the preset N-order generator matrix may be expressed as $G_8 = B_8 F_{RS8}^{\otimes n}$, wherein, $$F_{RS8} = \begin{pmatrix} 1 & 1 & 1 & 1 & 1 & 1 & 1 & 0 \\ \alpha & \alpha^2 & \alpha^3 & \alpha^4 & \alpha^5 & \alpha^6 & 1 & 0 \\ \alpha^2 & \alpha^4 & \alpha^6 & \alpha^1 & \alpha^3 & \alpha^5 & 1 & 0 \\ \alpha^3 & \alpha^6 & \alpha^2 & \alpha^5 & \alpha^1 & \alpha^4 & 1 & 0 \\ \alpha^4 & \alpha^1 & \alpha^5 & \alpha^2 & \alpha^6 & \alpha^3 & 1 & 0 \\ \alpha^5 & \alpha^3 & \alpha^1 & \alpha^6 & \alpha^4 & \alpha^2 & 1 & 0 \\ \alpha^6 & \alpha^5 & \alpha^4 & \alpha^3 & \alpha^2 & \alpha^1 & 1 & 0 \\ 1 & 1 & 1 & 1 & 1 & 1 & 1 & \alpha \end{pmatrix}.$$

As an optional implementation manner, the acquiring module 501 acquires the receiving sequence output by the encoding sequence on the channel and the check matrix. The encoding sequence is y', y' is transmitted in a physical medium channel, wherein the physical medium channel may be a wireless channel and may also be a wired channel, for simple expression, it is assumed in the embodiment of the present disclosure that the channel is an additive white Gaussian noise channel, y' and white Gaussian noise are transmitted to the decoding terminal, and the decoding terminal receives the sequence, namely receives the receiving sequence, which is marked as y. In the embodiment of the present disclosure, the receiving sequence y is decoded. The check matrix is a matrix set by the decoding terminal for check according to the input mapping sequence when decoding.

Further optionally, the input mapping sequence is a symbol set which belongs to a finite field GF(q) and includes a plurality of input mapping values, $q=2^m$, and m is a positive integer greater than 1. If m=2, the input mapping sequence may be expressed as a sequence composed of elements in (0, 1, $\alpha$, $\alpha^2$), the check matrix may include a first check matrix and a second check matrix, wherein the first check matrix may be expressed as $H_{01} = (1\ 1\ 1\ \alpha^2)$; and the second check matrix may be expressed as $$H_{02} = \begin{pmatrix} 1 & 1 & 1 & \alpha^2 \\ \alpha & \alpha^2 & 0 & \alpha^2 \end{pmatrix}.$$

Further optionally, the input mapping sequence is a symbol set which belongs to a finite field GF(q) and includes a plurality of input mapping values, $q=2^m$, and m is a positive integer greater than 1. If m=3, the input mapping sequence may be expressed as a sequence composed of elements in $(0, 1, \alpha, \alpha^2, \alpha^3, \alpha^4, \alpha^5, \alpha^6)$, the check matrix may include a third check matrix, a fourth check matrix, a fifth check matrix and a sixth check matrix, wherein the third check matrix may be expressed as $H_{001}=(1\ 1\ 1\ 1\ 1\ 1\ 1\ \alpha^6)$;

the fourth check matrix may be expressed as $$H_{002} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \end{pmatrix};$$

the fifth check matrix may be expressed as $$H_{003} = \begin{pmatrix} 1 & 1 & 1 & 1 & 1 & 1 & 1 & \alpha^6 \\ \alpha^6 & \alpha^5\alpha^4 & \alpha^3\alpha^2 & \alpha^1 1 & 0 \\ \alpha^5 & \alpha^3\alpha^1 & \alpha^6\alpha^4 & \alpha^2 1 & 0 \end{pmatrix};$$

and
the sixth check matrix may be expressed as $$H_{004} = \begin{pmatrix} 1 & 1 & 1 & 1 & 1 & 1 & 1 & \alpha^6 \\ \alpha^6 & \alpha^5\alpha^4 & \alpha^3\alpha^2 & \alpha^1 1 & 0 \\ \alpha^5 & \alpha^3\alpha^1 & \alpha^6\alpha^4 & \alpha^2 1 & 0 \\ \alpha^4 & \alpha^1\alpha^5 & \alpha^2\alpha^6 & \alpha^3 1 & 0 \end{pmatrix}.$$

As an optional implementation manner, the path processing module 502 carries out the Trellis path search according to the receiving sequence and the check matrix, and calculates the Trellis path likelihood information corresponding to the input mapping sequence according to the encoding sequence. In the embodiment, the parameter of the polar code may be set as $(N, K, A, u_{A^C})$. In the embodiment of the present disclosure, an SC decoding algorithm may be adopted to mainly estimate the input mapping sequence $u_1^N$, namely obtain the decision value corresponding to the input mapping sequence. Prior to estimation, the Trellis path likelihood information corresponding to the input mapping sequence needs to be calculated, in the embodiment of the present disclosure, the Trellis path likelihood information corresponding to the input mapping sequence may be calculated according to a condition likelihood function formula, for example, the condition likelihood function formula is:

$$L^{(i)}(y_1^N,\hat{u}_1^{i-1}) = \underset{u_i \in GF(q)}{argmax} P_{u_i/U_1^{i-1},Y_1^N}(u_i/\hat{u}_1^{i-1},y_1^N), \quad \text{(formula 1-2)}$$

wherein, $y_1^N$ refers to the receiving sequence, $u_1^N$ and $y_1^N$ satisfy probability distribution:

$$P_{U_1^N,Y_1^N}(u_1^N, y_1^N) = \frac{1}{q^N} W^N(y_1^N/u_1^N G_N).$$

$y_1^N$ expresses the receiving sequence $(y_1, y_2, y_3, \ldots, y_N)$, $u_1^N$ expresses the input mapping sequence $(u_1, u_2, \ldots, u_N)$, and $W^N(y_1^N/u_1^N G_N)$ expresses the probability of receiving $y_1^N$ when sending $u_1^N G_N$ in a binary channel.

It should be noted that, the implementation manners of the condition likelihood function formula are multiple, for example, may be the above formula 1-1, may also be another implementation manner and are not limited to the embodiment specifically.

As an optional implementation manner, a Trellis graph refers to a directed graph having a side marker and expresses a triad (V, E, A), wherein V refers to a node set, A refers to an alphabet set, E refers to a side set, each side may be expressed as a set composed of a sequential triad (v, a, v'), v, v'∈V, a∈A. V may be expressed as $(V_0, V_1, \ldots, V_n)$, a may be expressed as $(a_1, a_2, \ldots, a_n)$, and n is a positive integer greater than 0. Each directed path from $V_0$ to $V_n$ corresponds to side marker $(a_1, a_2, \ldots, a_n)$ with length n, then all the side markers constitute all code words of a block code C based on A, and the code words may be in one-to-one correspondence with marking paths.

A minimum conventional Trellis graph of a linear code may be constituted by a corresponding generator matrix or a check matrix, the decoding algorithm based on the Trellis graph includes a Viterbi algorithm, the Viterbi algorithm adopts a maximum-likelihood decoding principle, and an output end receives a vector y, searches a code word having the maximum probability P(y|c) according to the maximum-likelihood decoding principle, finds n paths corresponding to a probability value P and uses the code words corresponding to the paths as decoded code words.

In the embodiment of the present disclosure, the code word maximizing the P value is searched according to the condition likelihood function formula, path search is carried out through the Trellis graph, a path corresponding to $P_{max}$ is found, and then the corresponding code word in the path is acquired.

As an optional implementation manner, the making decision module 503 calculates the decision value corresponding to the input mapping sequence according to the Trellis path likelihood information corresponding to the input mapping sequence. Specifically, the input mapping sequence $u_1^N$ is estimated during the SC decoding, the decision value corresponding to the input mapping sequence is calculated, corresponding to the above formula 1-2, if $i \subset A$, making $\hat{u}_i = L^{(i)}(y_1^N,\hat{u}_1^{i-1})$; and if $i \subset A^C$, making $\hat{u}_i = u_i$ and then the corresponding $\hat{u}_i$, is calculated.

As an optional implementation manner, the de-mapping module 504 de-maps the calculated decision value corresponding to the input mapping sequence according to the preset mapping relation to obtain the decoding sequence. As for the decision value corresponding to the input mapping sequence obtained in step S205, de-mapping is performed and the decoding sequence is obtained. For example, when m=2, the input mapping sequence may be set as a sequence composed of elements in $(0, 1, \alpha, \alpha^2)$, the obtained decision values are de-mapped one by one according to the preset mapping relation 00~0, 01~1, 10~$\alpha$ and 11~$\alpha^2$, and the decoding sequence is obtained.

Further optionally, the input mapping sequence is a symbol set which belongs to a finite field GF(q) and includes a plurality of input mapping values, $q=2^m$, m is a positive integer greater than 1, and the decoding process of the polar code will be described below in detail with m=2 as an example.

As an optional implementation manner, the polar code is a channel encoding method based on a channel polarization theory, a channel polarization process includes channel combining and channel splitting, the channel combining refers to copying the known channel W to obtain $W_N$, and the channel splitting refers to a process of restoring the $W_N$ to N mutually independent channels. As shown in FIG. 3, is a schematic diagram of a channel combining process of a polar code provided by an embodiment of the present disclosure, the input mapping sequence corresponding to the schematic diagram of the channel combining process of the polar code belongs to a finite field GF(4), namely, $q=2^m$, $m=2$, the code length $N=2^4=16$, the receiving sequence $y_1^{16}$ is $(y_1, y_2, \ldots, y_{16})$, the input mapping sequence $u_1^{16}$ is $(u_1, u_2, \ldots, u_{16})$, $x_1^{16}$ may be expressed as $(x_1, x_2, \ldots, x_{16})$, and the encoding sequence $y_1^{16\prime}$ may be expressed as $(y_1', y_2', \ldots, y_{16}')$. As shown in FIG. 3, the encoding sequence $y_1^{16\prime}$ is obtained by $x_1^{16}$ passing through the encoding channel $W_{16/4}$, $y_1^{16\prime}$ is transmitted in the physical medium channel, and the sequence received by the decoding terminal is the receiving sequence $y_1^{16}$, for simple expression, it is assumed in the embodiment of the present disclosure that the channel is an additive white Gaussian noise channel, wherein, $y_1^{16}=y_1^{16\prime}+noise$, noise refers to additive white Gaussian noise (AWGN), and in the embodiment of the present disclosure, the receiving sequence $y_1^{16}$ is decoded. In combination with the channel combining process as shown in FIG. 3, the following decoding process may be obtained:

(1) calculating likelihood function values of $x_1$, $x_5$, $x_9$ and $x_{13}$ respectively according to the condition likelihood function formula 1-1 through Trellis path search, in accordance with a receiving vector $y_1^{16}$ and a first check matrix $H_{01}$, wherein $H_{01}=(1\ 1\ 1\ \alpha^2)$.

(2) calculating the likelihood function value of $u_1$ according to the likelihood function values of $x_1$, $x_5$, $x_9$ and $x_{13}$ and the check matrix $H_{01}$ through the Trellis path search, and calculating a decision value $\hat{u}_1$ corresponding to $u_1$.

(3) calculating the likelihood function value of $u_2$ according to the likelihood function values of $x_1$, $x_5$, $x_9$ and $x_{13}$, the $\hat{u}_1$ and a check matrix $H_{02}$ through the Trellis path search, and calculating a decision value $\hat{u}_2$ corresponding to $u_2$, wherein, $$H_{02} = \begin{pmatrix} 1 & 1 & 1 & \alpha^2 \\ \alpha & \alpha^2 & 0 & \alpha^2 \end{pmatrix}.$$

(4) calculating the likelihood function values of $u_3$ and $u_4$ according to the likelihood function values of $x_1$, $x_5$, $x_9$ and $x_{13}$, $\hat{u}_1$, $\hat{u}_2$ and a generator matrix $G_4$, and calculating decision values $\hat{u}_3$ and $\hat{u}_4$ corresponding to $u_3$ and $u_4$ respectively.

(5) calculating decision values $\hat{x}_1$, $\hat{x}_5$, $\hat{x}_9$, $\hat{x}_{13}$ corresponding to $x_1$, $x_5$, $x_9$ and $x_{13}$ respectively according to the decision values $\hat{u}_1$, $\hat{u}_2$, $\hat{u}_3$ and $\hat{u}_4$ and the generator matrix $G_4$.

(6) calculating the likelihood function values of $x_2$, $x_6$, $x_{10}$ and $x_{14}$ respectively according to the receiving sequence $y_1^{16}$, the decision values $\hat{x}_1$, $\hat{x}_5$, $\hat{x}_9$, $\hat{x}_{13}$ and the check matrix $H_{02}$ through the Trellis path search.

(7) calculating the likelihood function value of $u_5$ according to the likelihood function values of $x_2$, $x_6$, $x_{10}$, $x_{14}$ and the check matrix $H_{01}$ through the Trellis path search, and calculating a decision value $\hat{u}_5$ corresponding to $u_5$.

(8) calculating the likelihood function value of $u_6$ according to the likelihood function values of $x_2$, $x_6$, $x_{10}$, $x_{14}$, the decision value $\hat{u}_5$ and the check matrix $H_{02}$ through the Trellis path search, and calculating a decision value $\hat{u}_6$ corresponding to $u_6$.

(9) calculating the likelihood function values of $u_7$, $u_8$ according to the likelihood function values of $x_2$, $x_6$, $x_{10}$, $x_{14}$, the decision values $\hat{u}_5$, $\hat{u}_6$ and the generator matrix $G_4$, and calculating decision values $\hat{u}_7$, $\hat{u}_8$ corresponding to $u_7$, $u_8$ respectively.

(10) calculating decision values $\hat{x}_2$, $\hat{x}_6$, $\hat{x}_{10}$ and $\hat{x}_{14}$ corresponding to $x_2$, $x_6$, $x_{10}$ and $x_{14}$ respectively according to the decision values $\hat{u}_5$, $\hat{u}_6$, $\hat{u}_7$, and $\hat{u}_8$ and the generator matrix $G_4$.

(11) calculating the likelihood function values of $x_3$, $x_7$, $x_{11}$, $x_{15}$ respectively according to the receiving sequence $y_1^{16}$, the decision values $\hat{x}_2$, $\hat{x}_6$, $\hat{x}_{10}$ and $\hat{x}_{14}$ and the check matrix $H_{02}$ through the Trellis path search.

(12) calculating the likelihood function value of $u_9$ according to the likelihood function values of $x_3$, $x_7$, $x_{11}$, $x_{15}$ and the check matrix $H_{01}$ through the Trellis path search, and calculating a decision value $\hat{u}_9$ corresponding to $u_9$.

(13) calculating the likelihood function value of $u_{10}$ according to the likelihood function values of $x_3$, $x_7$, $x_{11}$, $x_{15}$, the decision value $\hat{u}_9$ and the check matrix $H_{02}$ through the Trellis path search, and calculating a decision value $\hat{u}_{10}$ corresponding to $u_{10}$.

(14) calculating the likelihood function values of $u_{11}$, $u_{12}$ according to the likelihood function values of $x_3$, $x_7$, $x_{11}$, $x_{15}$, the decision values $\hat{u}_9$, $\hat{u}_{10}$ and the generator matrix $G_4$, and calculating decision values $\hat{u}_{11}$, $\hat{u}_{12}$ corresponding to $u_{11}$, $u_{12}$ respectively.

(15) calculating decision values $\hat{x}_3$, $\hat{x}_7$, $\hat{x}_{11}$ and $x_{15}$ corresponding to $x_3$, $x_7$, $x_{11}$, $x_{15}$, respectively according to the decision values $\hat{u}_9$, $\hat{u}_{10}$, $\hat{u}_{11}$, $\hat{u}_{12}$ and the generator matrix $G_4$.

(16) calculating the likelihood function values of $x_4$, $x_8$, $x_{12}$, $x_{16}$ respectively according to the receiving sequence $y_1^{16}$, the decision values $\hat{x}_3$, $\hat{x}_7$, $\hat{x}_{11}$ and $\hat{x}_{15}$ and the check matrix $H_{02}$ through the Trellis path search.

(17) calculating the likelihood function value of $u_{13}$ according to the likelihood function values of $x_4$, $x_8$, $x_{12}$, $x_{16}$ and the check matrix $H_{01}$ through the Trellis path search, and calculating a decision value $\hat{u}_{13}$ corresponding to $u_{13}$.

(18) calculating the likelihood function value of $u_{14}$ according to the likelihood function values of $x_4$, $x_8$, $x_{12}$, $x_{16}$, the decision value $\hat{u}_{13}$ and the check matrix $H_{02}$ through the Trellis path search, and calculating a decision value $\hat{u}_{14}$ corresponding to $u_{14}$.

(19) calculating the likelihood function values of $u_{15}$, $u_{16}$ according to the likelihood function values of $x_4$, $x_8$, $x_{12}$, $x_{16}$, the decision values $\hat{u}_{13}$, $\hat{u}_{14}$ and the generator matrix $G_4$, and calculating decision values $\hat{u}_{15}$, $\hat{u}_{16}$ corresponding to $u_{15}$, $u_{16}$ respectively.

(20) calculating decision values $\hat{x}_4$, $\hat{x}_8$, $\hat{x}_{12}$ and $\hat{x}_{16}$ corresponding to $x_4$, $x_8$, $x_{12}$, $x_{16}$ respectively according to the decision values $\hat{u}_{13}$, $\hat{u}_{14}$, $\hat{u}_{15}$, $\hat{u}_{16}$ and the generator matrix $G_4$.

The obtained decision value corresponding to the input mapping sequence $u_1^{16}$ is $(\hat{u}_1, \hat{u}_2, \ldots, \hat{u}_{16})$, and then de-mapping is performed according to the preset mapping relation to obtain the decoding sequence.

Further optionally, the decoding process of the polar code is described above when the input mapping sequence belongs to the finite field GF(q), $q=2^m$, and $m=2$, m is a positive integer greater than 1, when $m=3$, the decoding process and steps refer to the decoding process and steps when $m=2$ described above, and will not be repeated herein, wherein the input mapping sequence may be expressed as a sequence composed of elements in (0, 1, $\alpha$, $\alpha^2$, $\alpha^3$, $\alpha^4$, $\alpha^5$, $\alpha^6$), the check matrix may include a third check matrix, a fourth check matrix, a fifth check matrix and a sixth check matrix, wherein the third check matrix may be expressed as:

$H_{001} = (1\ 1\ 1\ 1\ 1\ 1\ 1\ \alpha^6)$;

the fourth check matrix may be expressed as:

$$H_{002} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \end{pmatrix};$$

the fifth check matrix may be expressed as:

$$H_{003} = \begin{pmatrix} 1 & 1 & 1 & 1 & 1 & 1 & 1 & \alpha^6 \\ \alpha^6 & \alpha^5\alpha^4 & \alpha^3\alpha^2 & \alpha^1 1 & 0 \\ \alpha^5 & \alpha^3\alpha^1 & \alpha^6\alpha^4 & \alpha^2 1 & 0 \end{pmatrix};$$

and
the sixth check matrix may be expressed as:

$$H_{004} = \begin{pmatrix} 1 & 1 & 1 & 1 & 1 & 1 & 1 & \alpha^6 \\ \alpha^6 & \alpha^5\alpha^4 & \alpha^3\alpha^2 & \alpha^1 1 & 0 \\ \alpha^5 & \alpha^3\alpha^1 & \alpha^6\alpha^4 & \alpha^2 1 & 0 \\ \alpha^4 & \alpha^1\alpha^5 & \alpha^2\alpha^6 & \alpha^3 1 & 0 \end{pmatrix}.$$

When m>3, the decoding process and steps refer to the decoding process and steps when m=2 described above, and will not be repeated herein.

Further optionally, a decoding result of the polar code provided by the embodiment of the present disclosure is simulated, and the simulation result will be described below in detail by examples.

As an optional implementation manner, the obtained decoding result of the decoding process of the polar code when m=2 is simulated, as shown in FIG. 4a, is a schematic diagram of a decoding simulation result of a polar code provided by an embodiment of the present disclosure. FIG. 4(a) is a schematic diagram of the simulation result when the input mapping sequence belongs to a finite field GF(4), namely, q=2$^m$, m=2, the code length N=2048, and the code rate is 0.5, wherein, the horizontal axis refers to Eb/No, the vertical axis refers to FER, and 8 curves from top to bottom in total respectively correspond to corresponding simulation result curves when list=1, list=2, list=4, list=8, list=16, list=32, list=64, and list=128.

In the conventional art, encoding and decoding are carried out in a GF(2) field. Encoding is carried out via polar code cascading CRC, the original k bits used for transmitting information bits are divided into two parts, k-r bits are used for transmitting information, and the rest r bits are used for carrying out r-bit CRC check on the previous k-r bits. When performing SCL decoding, the CRC check is carried out on each survival path, and if at least one survival path in all list survival paths may pass the CRC check, a path having the maximum likelihood function is selected from the survival paths passing the CRC check; and otherwise, the path having the maximum likelihood function is selected from all list survival paths to serve as a decision path.

After SC decision, the number of list layers corresponding to each information bit is not constant, all information bits share list resources, the CRC check is carried out on each branch to decide whether stopping searching the survival path or not, if the CRC check is passed, the search on the survival path is stopped, and otherwise, the list value is increased to continue the search.

It can be seen from FIG. 4(a) that, when the abscissa is 1.2, the corresponding maximum list value is 128 and the average list value is 1.75; when the abscissa is 1.6, the corresponding maximum list value is 128 and the average list value is 1.06. The simulation result of the embodiment of the present disclosure is compared with the simulation result in the conventional art and correlation data may be obtained, shown in the following table as an example:

| Eb/N0 | | Conventional art | Embodiment of the present disclosure GF(4) |
|---|---|---|---|
| 1.2 | maximum list | 8192 | 128 |
|  | average list | 52.59 | 1.75 |
| 1.6 | maximum list | 8192 | 128 |
|  | average list | 2.47 | 1.06 |

It can be seen from the correlation data in the above table that, the embodiment of the present disclosure is implemented to simultaneously reduce the maximum list value and greatly reduce the average list value.

As shown in FIG. 4b, it is a schematic diagram of a decoding simulation result of a polar code in the conventional art. FIG. 4(b) is a schematic curve diagram of the simulation result in the conventional art, the horizontal axis refers to Eb/No, the vertical axis refers to FER, FIG. 4(b) is the schematic diagram of the simulation result when the input mapping sequence belongs to a finite field GF(2), and the code length N=2048, and there are 5 curves in FIG. 4(b) in total, taking the crossover points of the curves with the vertical axis as sequences, the curves are respectively as follows from top to bottom: curve 1: a continuous curve, curve 2: the code length=2304, curve 3: the code length=2048, curve 4: list=32, and curve 5: the code length=960. It can be seen from the curve 3 in FIG. 4(b) that, when FER=10$^{-3}$, the corresponding Eb/No=1.6 dB. It can be seen from FIG. 4(a) that, when Lmax=32 and FER=10$^{-3}$, Eb/No=1.32 dB, therefore, the embodiment of the present disclosure may be implemented to reduce the list value.

As shown in FIG. 4c, is a schematic diagram of another decoding simulation result of a polar code provided by an embodiment of the present disclosure. FIG. 4(c) is a schematic diagram of the simulation result when the input mapping sequence belongs to a finite field GF(8), namely, q=2$^m$, m=3, the code length N=1536, and the code rate is 0.5, wherein, the horizontal axis refers to Eb/No, the vertical axis refers to FER, the curve expresses a list value, it can be seen from FIG. 4(c) that although the code length is only 1536, when Lmax=4, and Eb/No=1.54 dB, FER=10$^{-3}$ may be achieved, so that the maximum list value is greatly reduced.

According to the decoding apparatus of the polar code provided by the embodiment of the present disclosure, a mapping module may map the input sequence according to the preset mapping relation to obtain the input mapping sequence, an encoding module encodes the input mapping sequence to obtain the encoding sequence, the encoding sequence is transmitted on the channel and the receiving sequence is output, the path processing module may carry out the Trellis path search according to the receiving sequence and the check matrix, the making decision module calculates to obtain the decision value corresponding to the input mapping sequence, and the de-mapping module de-maps the decision value corresponding to the input mapping sequence according to the preset mapping relation, and the decoding sequence is obtained. The input mapping sequence is a sequence obtained by mapping the input sequence according to the preset mapping relation, the input mapping sequence belongs to the finite field GF(q), $q=2^m$, m is a positive integer greater than 1, the receiving sequence is a sequence received from the channel after the input mapping sequence is encoded, when decoding the polar code, the Trellis path search is carried out, the decision value is calculated and de-mapping is performed to simultaneously reduce the maximum list value and greatly reduce the average list value.

Figure 6:
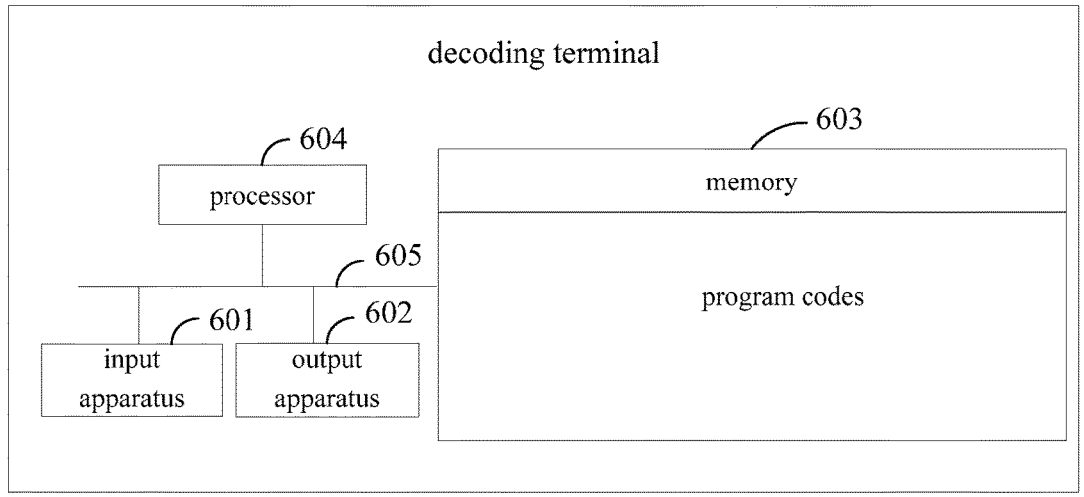
FIG. 6 is a structure diagram of a decoding terminal provided by an embodiment of the present disclosure.

Please refer to FIG. 6, is a structure diagram of a decoding terminal provided by an embodiment of the present disclosure, wherein, the decoding terminal provided by the embodiment corresponds to the method as shown in FIG. 1 and FIG. 2 and is an executive body of the decoding method of the polar code as shown in FIG. 1 and FIG. 2.

As an optional implementation manner, the decoding apparatus of the polar code provided by the embodiment of the present disclosure may be a decoding terminal, wherein the decoding terminal may be a mobile user equipment, a PC user equipment, a device serving global communication or other types of user equipment, and the specific implementation manner of the user equipment is not limited.

The specific implementation manner is as shown in FIG. 6, the decoding terminal provided by the embodiment of the present disclosure includes: an input apparatus 601, an output apparatus 602, a memory 603 and a processor 604, wherein a group of program codes is stored in the memory 603, and the processor 604 is configured to call the program codes stored in the memory 603 and to execute the following operations:

acquiring a receiving sequence and a check matrix, wherein the receiving sequence is output on a channel after an input mapping sequence is encoded;

carrying out Trellis path search according to the acquired receiving sequence and the check matrix, and calculating Trellis path likelihood information corresponding to the input mapping sequence;

calculating a decision value corresponding to the input mapping sequence according to the Trellis path likelihood information corresponding to the input mapping sequence; and de-mapping the calculated decision value corresponding to the input mapping sequence according to the preset mapping relation to obtain a decoding sequence.

As an optional implementation manner, the input mapping sequence is: a sequence obtained by mapping an input sequence according to the preset mapping relation; and the processor 604 calculates Trellis path likelihood information corresponding to the input mapping sequence includes:

calculating the Trellis path likelihood information corresponding to the input mapping sequence according to an encoding sequence, wherein the encoding sequence is a sequence obtained by encoding the input mapping sequence.

As an optional implementation manner, the input mapping sequence is a symbol set which belongs to a finite field GF(q) and includes a plurality of input mapping values, wherein $q=2^m$, and m is a positive integer greater than 1; and the preset mapping relation includes: correspondingly mapping every m bits in the input sequence to each input mapping value.

As an optional implementation manner, the encoding sequence is a sequence obtained by encoding the input mapping sequence through an encoding formula, the encoding formula is: $x_1^N = u_1^N G_N$, the encoding sequence is obtained by $x_1^N$ refers to the input mapping sequence, the encoding sequence is obtained by $x_1^N$ through an encoding channel, $G_N$ refers to a preset N-order generator matrix, $G_N = B_N F^{\otimes n}$, $B_N$ refers to a permutation matrix, $F^{\otimes n}$ refers to a Kronecker power, $F^{\otimes n} = F \otimes F^{\otimes(n-1)}$, N refers to a code length, $N = m2^{mn}$, $n \geq 0$.

As an optional implementation manner, the processor 604 calculates Trellis path likelihood information corresponding to the input mapping sequence includes:

calculating the Trellis path likelihood information corresponding to the input mapping sequence according to a condition likelihood function formula, and the condition likelihood function formula is:

$$L^{(i)}(y_1^N, \hat{u}_1^{i-1}) = (_{u_i}^i \in GF(q)^{argmax} P_{U_i/U_1^{i-1},Y_1^N}(u_i/\hat{u}_1^{i-1}, y_1^N)),$$

wherein, $y_1^N$ refers to the receiving sequence, $u_1^N$ and $y_1^N$ satisfy probability distribution:

$$P_{U_1^N, Y_1^N}(u_1^N, y_1^N) = \frac{1}{q^N} W^N(y_1^N / u_1^N G_N).$$

As an optional implementation manner, the parameter of the polar code is (N, K, A, $u_{A^C}$), A refers to a set of information bit indexes, $A^C$ refers to a complementary set of A, K refers to the number of elements in A, and $u_{A^C}$ refers to frozen bits with the number of (N−K);

The processor 604 calculates a decision value corresponding to the input mapping sequence according to the calculated Trellis path likelihood information corresponding to the input mapping sequence through includes:

if $i \subset A$, making $\hat{u}_i = L^{(i)}(y_1^N, \hat{u}_1^{i-1})$; and if $i \subset A^C$, making $\hat{u}_i = u_i$.

As an optional implementation manner, when m=2, the input mapping sequence is a sequence composed of elements in $(0, 1, \alpha, \alpha^2)$; and the preset N-order generator matrix is: $G_4 = B_4 F_{RS4}^{\otimes n}$, wherein, $$F_{RS4} = \begin{pmatrix} 1 & 1 & 1 & 0 \\ \alpha & \alpha^2 & 1 & 0 \\ \alpha^2 & \alpha & 1 & 0 \\ 1 & 1 & 1 & \alpha \end{pmatrix}$$

As an optional implementation manner, when m=3, the input mapping sequence is a sequence composed of elements in $(0, 1, \alpha, \alpha^2, \alpha^3, \alpha^4, \alpha^5, \alpha^6)$; and the preset N-order generator matrix is: $G_8 = B_8 F_{RS8}^{\otimes n}$, wherein, $$F_{RS8} = \begin{pmatrix} 1 & 1 & 1 & 1 & 1 & 1 & 1 & 0 \\ \alpha & \alpha^2 & \alpha^3 & \alpha^4 & \alpha^5 & \alpha^6 & 1 & 0 \\ \alpha^2 & \alpha^4 & \alpha^6 & \alpha^1 & \alpha^3 & \alpha^5 & 1 & 0 \\ \alpha^3 & \alpha^6 & \alpha^2 & \alpha^5 & \alpha^1 & \alpha^4 & 1 & 0 \\ \alpha^4 & \alpha^1 & \alpha^5 & \alpha^2 & \alpha^6 & \alpha^3 & 1 & 0 \\ \alpha^5 & \alpha^3 & \alpha^1 & \alpha^6 & \alpha^4 & \alpha^2 & 1 & 0 \\ \alpha^6 & \alpha^5 & \alpha^4 & \alpha^3 & \alpha^2 & \alpha^1 & 1 & 0 \\ 1 & 1 & 1 & 1 & 1 & 1 & 1 & \alpha \end{pmatrix}.$$

As an optional implementation manner, when m=2, the check matrix includes a first check matrix and a second check matrix, and the first check matrix is: $H_{01} = (1\ 1\ 1\ \alpha^2)$; and the second check matrix is:

$$H_{02} = \begin{pmatrix} 1 & 1 & 1 & \alpha^2 \\ \alpha & \alpha^2 & 0 & \alpha^2 \end{pmatrix}.$$

As an optional implementation manner, when m=3, the check matrix includes a third check matrix, a fourth check matrix, a fifth check matrix and a sixth check matrix, wherein the third check matrix is: $H_{001}=(1\ 1\ 1\ 1\ 1\ 1\ 1\ \alpha^6)$;
the fourth check matrix is:

$$H_{002} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \end{pmatrix};$$

the fifth check matrix is:

$$H_{003} = \begin{pmatrix} 1 & 1 & 1 & 1 & 1 & 1 & 1 & \alpha^6 \\ \alpha^6 & \alpha^5\alpha^4 & \alpha^3\alpha^2 & \alpha^1 1 & 0 \\ \alpha^5 & \alpha^3\alpha^1 & \alpha^6\alpha^4 & \alpha^2 1 & 0 \end{pmatrix};$$

and
the sixth check matrix is:

$$H_{004} = \begin{pmatrix} 1 & 11 & 11 & 11 & \alpha^6 \\ a^6 & a^5 a^4 & a^3 a^2 & a^1 1 & 0 \\ a^5 & a^3 a^1 & a^6 a^4 & a^2 1 & 0 \\ a^4 & a^1 a^5 & a^2 a^6 & a^3 1 & 0 \end{pmatrix}.$$

Wherein, the processor 604 may be a central processing unit (CPU), an application-specific integrated circuit (ASIC), etc. Wherein, the base station in the embodiment may further include a bus 605. The input apparatus 601, the output apparatus 602, the memory 603 and the processor 604 may be connected and communicate through the bus 605. The memory 603 is configured to store the acquired receiving sequence and the decoding sequence obtained by decoding.

In the above technical solution, the decoding terminal is provided, including: the input apparatus, the output apparatus, the memory and the processor, the processor may carry out Trellis path search according to the receiving sequence and the check matrix, wherein the receiving sequence is output on the channel after the input mapping sequence is encoded, calculate the decision value corresponding to the input mapping sequence, de-map the decision value corresponding to the input mapping sequence according to the preset mapping relation, and obtain the decoding sequence. The input mapping sequence is a sequence obtained by mapping the input sequence according to the preset mapping relation, the input mapping sequence belongs to the finite field GF(q), $q=2^m$, m is a positive integer greater than 1, the receiving sequence is a sequence received from the channel after the input mapping sequence is encoded, when decoding the polar code, carrying out the Trellis path search, calculating the decision value and de-mapping, so as to simultaneously reduce a maximum list value and greatly reduce an average list value.

In summary, according to the decoding method and apparatus of the polar code provided by the embodiment of the present disclosure, the input mapping sequence may be a sequence obtained by mapping the input sequence according to the preset mapping relation, the encoding sequence may be a sequence obtained by encoding the input mapping sequence, the encoding sequence is transmitted on the channel and the receiving sequence is output, the Trellis path search may be carried out according to the receiving sequence and the check matrix, the decision value corresponding to the input mapping sequence is calculated, the decision value corresponding to the input mapping sequence is de-mapped according to the preset mapping relation, and the decoding sequence is obtained. The input mapping sequence is a sequence obtained by mapping the input sequence according to the preset mapping relation, the input mapping sequence belongs to the finite field GF(q), $q=2^m$, m is a positive integer greater than 1, the receiving sequence is a sequence received from the channel after the input mapping sequence is encoded, when decoding the polar code, carrying out the Trellis path search, calculating the decision value and de-mapping, so as to simultaneously reduce a maximum list value and greatly reduce an average list value.

Specifically, it can be seen from the comparison of the simulation result corresponding to the decoding method of the polar code provided by the embodiment of the present disclosure and the decoding simulation result of the polar code in the conventional art that, the maximum list size of decoding is greatly reduced, and when the input mapping sequence belongs to the finite field GF(4), the code length is 2048, the code rate is 0.5 and FER=$10^{-3}$, the maximum list size is 1.5% of the conventional art; the average list size is greatly reduced; and when the input mapping sequence belongs to the finite field GF(4), the code length is 2048, the code rate is 0.5 and Eb/No=1.2, the average list size is 3.3% of the conventional art.

By adopting the embodiment of the present disclosure, the maximum list size may be greatly reduced, the user experience is improved, the hardware implementation cost is saved, fixed logic resources are configured for the maximum list size on the premise of guaranteeing a total frame error ratio to improve the degree of parallelism, and the embodiment of the present disclosure reduces the maximum list size, so as to reduce the occupancy volume of total logic resources.

Through the above described embodiments, those skilled in the art may clearly understand that the present disclosure may be implemented in hardware or firmware, or a combination thereof. When being implemented by the software, the above functions may be stored in a computer readable medium or transmitted as one or more instructions or codes on the computer-readable medium. The computer-readable medium includes a computer storage medium and a communication medium, wherein the communication medium includes any medium which facilitates transmitting a computer program from one place to another place. The storage medium may be any available medium capable of being accessed by a computer. As an example, but not limited thereto, the computer-readable medium may include a RAM, a ROM, an EEPROM, a CD-ROM or other optical disk storage, magnetic disk storage media or other magnetic storage devices, or any other media capable of being used for carrying or storing desired program codes having instructions or data structure forms. In addition, any connection may become the computer readable medium properly. For example, if the software is transmitted from a website, a server or other remote sources by a coaxial cable, a fiber optic cable, a twisted pair, a digital subscriber line (DSL) or wireless technology such as infrared, radio and microwave, then the coaxial cable, the fiber optic cable, the twisted pair, the DSL or the wireless technology such as infrared, radio and microwave is contained in the fixation of the belonging medium. As used in the present disclosure, a disk (Disk) and a disc include a compact disc (CD), a laser disc, an optical disc, a digital versatile disc (DVD), a floppy disk and a Blu-ray disc, wherein the disk generally magnetically copies data, while the disc optically copies the data by laser. The above combinations should also be incorporated within the protection scope of the computer-readable medium.

The foregoing descriptions are merely preferred embodiments of the present disclosure, but of course, cannot be used for limiting the protection scope of the present disclosure. Therefore, equivalent variations made according to the claims of the present disclosure are still encompassed in the scope of the present disclosure.

What is claimed is:

1. A decoding method of a polar code which is performed by a decoding terminal, comprising:
   receiving a receiving sequence which is output on a channel after an input mapping sequence is encoded;
   determining a check matrix corresponding to the input mapping sequence;
   carrying out Trellis path search according to the receiving sequence and the check matrix, and determining Trellis path likelihood information corresponding to the input mapping sequence;
   determining a decision value corresponding to the input mapping sequence according to the Trellis path likelihood information corresponding to the input mapping sequence; and
   determining a decoded sequence by de-mapping the decision value corresponding to the input mapping sequence according to a preset mapping relation.

2. The method of claim 1, wherein the input mapping sequence is a sequence obtained by mapping an input sequence according to the preset mapping relation; and
   the determining the Trellis path likelihood information corresponding to the input mapping sequence comprises:
   determining the Trellis path likelihood information corresponding to the input mapping sequence according to an encoding sequence, wherein the encoding sequence is a sequence obtained by encoding the input mapping sequence.

3. The method of claim 2, wherein the input mapping sequence is a symbol set which belongs to a finite field $GF(q)$ and comprises a plurality of input mapping values, wherein $q=2^m$, and $m$ is a positive integer greater than 1; and
   the preset mapping relation comprises: correspondingly mapping every $m$ bits in the input sequence to each input mapping value.

4. The method of claim 3, wherein the encoding sequence is a sequence obtained by encoding the input mapping sequence through an encoding formula, the encoding formula is: $x_1^N = u_1^N G_N$, the encoding sequence is obtained by $x_1^N$ through an encoding channel, wherein $u_1^N$ refers to the input mapping sequence, $G_N$ refers to a preset N-order generator matrix, $G_N = B_N F^{\otimes n}$, $B_N$ refers to a permutation matrix, $F^{\otimes n}$ refers to a Kronecker power, $F^{\otimes n} = F \otimes F^{\otimes (n-1)}$, $N$ refers to a code length, $N = m2^{mn}$, $n \geq 0$.

5. The method of claim 4, wherein the determining the Trellis path likelihood information corresponding to the input mapping sequence comprises:
   calculating the Trellis path likelihood information corresponding to the input mapping sequence according to a condition likelihood function formula, and the condition likelihood function formula is:

$$L^{(i)}(y_1^N, \hat{u}_1^{i-1}) = \underset{(u_i/\hat{u}_1^{i-1}, y_1^N)}{\mathrm{argmax}} P_{u_i/U_1^{i-1}, Y_1^N}(u_i \in GF(q)),$$

wherein, $y_1^N$ refers to the receiving sequence, $u_1^N$ and $y_1^N$ satisfy probability distribution:

$$P_{U_1^N, Y_1^N}(u_1^N, y_1^N) = \frac{1}{q^N} W^N(y_1^N / u_1^N G_N).$$

6. The method of claim 5, wherein a parameter of the polar code is $(N, K, A, u_{A^c})$, $A$ refers to a set of information bit indexes, $A^C$ refers to a complementary set of $A$, $K$ refers to the number of elements in $A$, and $u_{A^c}$ refers to frozen bits with the number of $(N-K)$;
   the determining the decision value corresponding to the input mapping sequence according to the Trellis path likelihood information corresponding to the input mapping sequence comprises:
   if $i \subset A$, making $\hat{u}_i = L^{(i)}(y_1^N, \hat{u}_1^{i-1})$; and
   if $i \subset A^C$, making $\hat{u}_i = u_i$.

7. The method of claim 3, wherein when $m=2$, the input mapping sequence is a sequence composed of elements in $(0, 1, \alpha, \alpha^2)$; and the preset N-order generator matrix is: $G_4 = B_4 F_{RS4}^{\otimes n}$, wherein, $$F_{RS4} = \begin{pmatrix} 1 & 1 & 1 & 0 \\ \alpha & \alpha^2 & 1 & 0 \\ \alpha^2 & \alpha & 1 & 0 \\ 1 & 1 & 1 & \alpha \end{pmatrix}.$$

8. The method of claim 7, wherein when $m=2$, the check matrix comprises a first check matrix and a second check matrix, wherein the first check matrix is: $H_{01} = (1\ 1\ 1\ \alpha^2)$; and the second check matrix is:

$$H_{02} = \begin{pmatrix} 1 & 1 & 1 & \alpha^2 \\ \alpha & \alpha^2 & 0 & \alpha^2 \end{pmatrix}.$$

9. The method of claim 3, wherein when $m=3$, the input mapping sequence is a sequence composed of elements in $(0, 1, \alpha, \alpha^2, \alpha^3, \alpha^4, \alpha^5, \alpha^6)$; and the preset N-order generator matrix is: $G_8 = B_8 F_{RS8}^{\otimes n}$, wherein, $$F_{RS8} = \begin{pmatrix} 1 & 1 & 1 & 1 & 1 & 1 & 1 & 0 \\ \alpha & \alpha^2 & \alpha^3 & \alpha^4 & \alpha^5 & \alpha^6 & 1 & 0 \\ \alpha^2 & \alpha^4 & \alpha^6 & \alpha^1 & \alpha^3 & \alpha^5 & 1 & 0 \\ \alpha^3 & \alpha^6 & \alpha^2 & \alpha^5 & \alpha^1 & \alpha^4 & 1 & 0 \\ \alpha^4 & \alpha^1 & \alpha^5 & \alpha^2 & \alpha^6 & \alpha^3 & 1 & 0 \\ \alpha^5 & \alpha^3 & \alpha^1 & \alpha^6 & \alpha^4 & \alpha^2 & 1 & 0 \\ \alpha^6 & \alpha^5 & \alpha^4 & \alpha^3 & \alpha^2 & \alpha^1 & 1 & 0 \\ 1 & 1 & 1 & 1 & 1 & 1 & 1 & \alpha \end{pmatrix}.$$

10. The method of claim 9, wherein when $m=3$, the check matrix comprises a third check matrix, a fourth check matrix, a fifth check matrix and a sixth check matrix, wherein the third check matrix is: $H_{001}$=(1 1 1 1 1 1 1 $\alpha^6$); the fourth check matrix is:

$$H_{002} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \end{pmatrix};$$

the fifth check matrix is:

$$H_{003} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \end{pmatrix};$$

and
the sixth check matrix is:

$$H_{004} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \\ \alpha^5 & \alpha^3 & \alpha^1 & \alpha^6 & \alpha^4 & \alpha^2 & 1 & 0 \\ \alpha^4 & \alpha^1 & \alpha^5 & \alpha^2 & \alpha^6 & \alpha^3 & 1 & 0 \end{pmatrix}.$$

11. A decoding apparatus of a polar code, comprising:
a processor; and
a non-transitory computer-readable medium including computer-executable instructions that, when executed by the processor, facilitate the decoding apparatus carrying out a method comprising:
receiving a receiving sequence which is output on a channel after an input mapping sequence is encoded;
determining a check matrix corresponding to the input mapping sequence;
carrying out Trellis path search according to the receiving sequence and the check matrix, and determining Trellis path likelihood information corresponding to the input mapping sequence;
determining a decision value corresponding to the input mapping sequence according to the Trellis path likelihood information corresponding to the input mapping sequence; and
determining a decoded sequence by de-mapping the decision value corresponding to the input mapping sequence according to a preset mapping relation.

12. The apparatus of claim 11, wherein the input mapping sequence is a sequence obtained by mapping an input sequence according to the preset mapping relation; and
wherein the determining the Trellis path likelihood information corresponding to the input mapping sequence comprises:
determining the Trellis path likelihood information corresponding to the input mapping sequence according to an encoding sequence, wherein the encoding sequence is a sequence obtained by encoding the input mapping sequence.

13. The apparatus of claim 12, wherein the input mapping sequence is a symbol set which belongs to a finite field GF(q) and comprises a plurality of input mapping values, wherein q=$2^m$, and m is a positive integer greater than 1; and
the preset mapping relation comprises: correspondingly mapping every m bits in the input sequence to each input mapping value.

14. The apparatus of claim 13, wherein the encoding sequence is a sequence obtained by encoding the input mapping sequence through an encoding formula, the encoding formula is: $x_1^N = u_1^N G_N$, the encoding sequence is obtained by $x_1^N$ through an encoding channel, wherein $u_1^N$ refers to the input mapping sequence, $G_N$ refers to a preset N-order generator matrix, $G_N = B_N F^{\otimes n}$, $B_N$ refers to a permutation matrix, $F^{\otimes n}$ refers to a Kronecker power, $F^{\otimes n} = F \otimes F^{\otimes (n-1)}$, N refers to a code length, N=$m2^{mn}$, n≥0.

15. The apparatus of claim 14, wherein the determining the Trellis path likelihood information corresponding to the input mapping sequence comprises:
determining the Trellis path likelihood information corresponding to the input mapping sequence according to a condition likelihood function formula, and the condition likelihood function formula is:

$$L^{(i)}(y_1^N, \hat{u}_1^{i-1}) = (u_i \in GF(q))^{argmax} P_{u_i/U_1^{i-1}, Y_1^N}(u_i/\hat{u}_1^{i-1}, y_1^N),$$

wherein, $y_1^N$ refers to the receiving sequence, $u_1^N$ and $y_1^N$ satisfy probability distribution:

$$P_{U_1^N, Y_1^N}(u_1^N, y_1^N) = \frac{1}{q^N} W^N(y_1^N / u_1^N G_N).$$

16. The apparatus of claim 15, wherein a parameter of the polar code is (N, K, A, $u_{A^C}$), A refers to a set of information bit indexes, $A^C$ refers to a complementary set of A, K refers to the number of elements in A, and $u_{A^C}$ refers to frozen bits with the number of (N−K);
wherein the determining the decision value corresponding to the input mapping sequence according to the Trellis path likelihood information corresponding to the input mapping sequence comprises:
if i ⊂ A, making $\hat{u}_i = L^{(i)}(y_1^N, \hat{u}_1^{i-1})$; and
if i ⊂ $A^C$, making $\hat{u}_i = u_i$.

17. The apparatus of claim 13, wherein when m=2, the input mapping sequence is a sequence composed of elements in (0, 1, $\alpha$, $\alpha^2$); and the preset N-order generator matrix is: $G_4 = B_4 F_{RS4}^{\otimes n}$, wherein, $$F_{RS4} = \begin{pmatrix} 1 & 1 & 1 & 0 \\ \alpha & \alpha^2 & 1 & 0 \\ \alpha^2 & \alpha & 1 & 0 \\ 1 & 1 & 1 & \alpha \end{pmatrix}.$$

18. The apparatus of claim 17, wherein when m=2, the check matrix comprises a first check matrix and a second check matrix, wherein the first check matrix is: $H_{01}$=(1 1 1 $\alpha^2$); and
the second check matrix is:

$$H_{02} = \begin{pmatrix} 1 & 1 & 1 & \alpha^2 \\ \alpha & \alpha^2 & 0 & \alpha^2 \end{pmatrix}.$$

19. The apparatus of claim 13, wherein when m=3, the input mapping sequence is a sequence composed of elements in (0, 1, $\alpha$, $\alpha^2$, $\alpha^3$, $\alpha^4$, $\alpha^5$, $\alpha^6$); and the preset N-order generator matrix is: $G_8 = B_8 F_{RS8}^{\otimes n}$, wherein, $$F_{RS8} = \begin{pmatrix} 1 & 1 & 1 & 1 & 1 & 1 & 1 & 0 \\ \alpha & \alpha^2 & \alpha^3 & \alpha^4 & \alpha^5 & \alpha^6 & 1 & 0 \\ \alpha^2 & \alpha^4 & \alpha^6 & \alpha^1 & \alpha^3 & \alpha^5 & 1 & 0 \\ \alpha^3 & \alpha^6 & \alpha^2 & \alpha^5 & \alpha^1 & \alpha^4 & 1 & 0 \\ \alpha^4 & \alpha^1 & \alpha^5 & \alpha^2 & \alpha^6 & \alpha^3 & 1 & 0 \\ \alpha^5 & \alpha^3 & \alpha^1 & \alpha^6 & \alpha^4 & \alpha^2 & 1 & 0 \\ \alpha^6 & \alpha^5 & \alpha^4 & \alpha^3 & \alpha^2 & \alpha^1 & 1 & 0 \\ 1 & 1 & 1 & 1 & 1 & 1 & 1 & \alpha \end{pmatrix}.$$

20. The apparatus of claim 19, wherein when m=3, the check matrix comprises a third check matrix, a fourth check matrix, a fifth check matrix and a sixth check matrix, wherein the third check matrix is: $H_{001}$=(1 1 1 1 1 1 1 $\alpha^6$);
the fourth check matrix is:

$$H_{002} = \begin{pmatrix} 1 & 1 & 1 & 1 & 1 & 1 & 1 & \alpha^6 \\ \alpha^6 & \alpha^5 & \alpha^4 & \alpha^3 & \alpha^2 & \alpha^1 & 1 & 0 \end{pmatrix};$$

the fifth check matrix is:

$$H_{003} = \begin{pmatrix} 1 & 1\;1 & 1\;1 & 1\;1 & \alpha^6 \\ \alpha^6 & \alpha^5\alpha^4 & \alpha^3\alpha^2 & \alpha^1 1 & 0 \\ \alpha^5 & \alpha^3\alpha^1 & \alpha^6\alpha^4 & \alpha^2 1 & 0 \end{pmatrix};$$

and the sixth check matrix is:

$$H_{001} = \begin{pmatrix} 1 & 1\;1 & 1\;1 & 1\;1 & \alpha^6 \\ \alpha^6 & \alpha^5\alpha^4 & \alpha^3\alpha^2 & \alpha^1 1 & 0 \\ \alpha^5 & \alpha^3\alpha^1 & \alpha^6\alpha^4 & \alpha^2 1 & 0 \\ \alpha^4 & \alpha^1\alpha^5 & \alpha^2\alpha^6 & \alpha^3 1 & 0 \end{pmatrix}.$$

* * * * *